(12) United States Patent
Vucetic et al.

(10) Patent No.: US 8,416,730 B2
(45) Date of Patent: Apr. 9, 2013

(54) DISTRIBUTED TURBO CODING AND RELAYING PROTOCOLS

(75) Inventors: Branka Vucetic, Vaucluse (AU); Yonghui Li, Hurstville (AU)

(73) Assignee: University of Sydney (AU)

( * ) Notice: Subject to any disclaimer, the term of this patent is extended or adjusted under 35 U.S.C. 154(b) by 548 days.

(21) Appl. No.: 12/559,032

(22) Filed: Sep. 14, 2009

(65) Prior Publication Data
US 2010/0091697 A1 Apr. 15, 2010

Related U.S. Application Data

(63) Continuation of application No. PCT/AU2007/001729, filed on Nov. 9, 2007.

(30) Foreign Application Priority Data

Mar. 14, 2007 (AU) .................................. 2007901330
May 31, 2007 (AU) .................................. 2007902931

(51) Int. Cl.
*H04B 7/14* (2006.01)
(52) U.S. Cl. ........................................................ 370/315
(58) Field of Classification Search .................. 370/315
See application file for complete search history.

(56) References Cited

U.S. PATENT DOCUMENTS

| | | | |
|---|---|---|---|
| 2004/0266339 A1* | 12/2004 | Larsson | 455/7 |
| 2005/0175184 A1 | 8/2005 | Grover et al. | |
| 2005/0265387 A1 | 12/2005 | Khojastepour et al. | |
| 2007/0190934 A1* | 8/2007 | Kim et al. | 455/7 |
| 2007/0211786 A1* | 9/2007 | Shattil | 375/141 |
| 2007/0223438 A1* | 9/2007 | Bennett | 370/338 |
| 2008/0076349 A1* | 3/2008 | Hwang et al. | 455/7 |

OTHER PUBLICATIONS

"Distributed Turbo Codes: Towards the Capacity of the Relay Channel, by Matthew Valenti and Bin Zhao" at IEEE Int'l Conf. on Communication (ICC) 2003, VTC 2003-Fall.*
"Symbol Error Rate of Selection Amplify-and-Forward Relay Systems, by Raviraj Adve et al." at IEEE Communications Letters Nov. 2006.*
Janani, et al., Coded Cooperation in Wireless Communications: Space-Time Transmission and Iterative Decoding, IEEE Transactions on Signal Processing, 52(2):362-371 (2004).

(Continued)

*Primary Examiner* — Ayaz Sheikh
*Assistant Examiner* — Hai-Chang Hsiung
(74) *Attorney, Agent, or Firm* — Ann-Louise Kerner; K&L Gates LLP

(57) ABSTRACT

This invention concerns distributed turbo coding and relaying protocols in wireless relay networks. In particular, the invention concerns a method for relaying signals at a relay node, a method for processing signals at a destination node, a relay system and software to perform the methods. The wireless relay networks comprise a source node, a destination node and one or more relay nodes. At a relay node, the invention comprises the steps of receiving a signal from a first node; decoding the received signal; and if the received signal is decoded incorrectly, employing an Amplify-And-Forward (AAF) relaying protocol comprising the steps of amplifying the received signal and then transmitting the amplified signal to a second node; but otherwise, employing a Decode-And-Forward (DAF) relaying protocol comprising the steps of re-encoding the decoded signal and then transmitting the coded signal to the second node. At a destination node, data transmitted by the source node is recovered by combining all signals received from the source and relay nodes and then decoding the combined signal.

11 Claims, 23 Drawing Sheets

OTHER PUBLICATIONS

Laneman, et al., "Energy-Efficient Antenna Sharing and Relaying for Wireless Networks," Proc. IEEE Wireless Communications, Networking Conf., pp. 7-12 (2000).

Li, et al., "Distributed Turbo Coding With Soft Information Relaying in Wireless Sensor Networks," EUROCON 2005, Serbia & Montenegro, Belgrade, Nov. 22-24, 2005, pp. 29-32.

Li, et al., "Distributed Turbo Coding With Soft Information Relaying in Multihop Relay Networks," IEEE Journal on Selected Areas in Communications, 24(11):2040-2050 (2006).

Ng, et al., "Selection of Weight Quantisation Accuracy for Radial Basis Function Neural Network Using Stochastic Sensitivity Measure," Electronics Letters, 39(10):787-789 (2003).

Zhao, et al., "Distributed Turbo Coded Diversity for Relay Channel," Electronics Letters, 39(10):786-787 (2003).

International Search Report and Written Opinion of the International Searching Authority, PCT/AU2007/001729, Jan. 18, 2008, 6 pages.

* cited by examiner

DISTRIBUTED TURBO CODING AND RELAYING PROTOCOLS

CROSS-REFERENCE TO RELATED APPLICATION

This application is a continuation of International Application Serial No. PCT/AU2007/001729, filed Nov. 9, 2007, pending, which claims priority under Section 119 to AU 2007901330 filed Mar. 14, 2007 and AU 2007902931 filed May 31, 2007.

TECHNICAL FIELD

This invention concerns distributed turbo coding and relaying protocols in wireless relay networks. In particular, the invention concerns a method for relaying signals at a relay node, a method for processing signals at a destination node, a relay system and software to perform the methods.

BACKGROUND ART

In wireless communication systems, diversity has been an effective technique in combating detrimental effects of channel fading caused by multi-path propagation and Doppler shift. Specifically, a spatial diversity can be achieved by a multiple-input-multiple-output (MIMO) system by exploiting space time coding. However, in a cellular network or wireless sensor networks, due to the limited size, cost and hardware limitation, it may not be possible for a mobile terminal or wireless sensor nodes to equip with multiple transmit antennas.

To overcome such limitation, a new form of diversity technique, called user cooperation diversity or distributed spatial diversity, has been proposed recently, for cooperative cellular networks or wireless sensor networks. The idea is to allow different users to communicate cooperatively and share their antennas to achieve a virtual MIMO link, thus achieving a spatial diversity gain. The relayed transmission can be viewed as a good example of distributed diversity techniques. In the relay channel, the source sends the source information to the relays. The relays detect the received signals, reconstruct them and then forward them to the destination. At the destination, by properly combining the received signals from the source and relays, a distributed diversity can be achieved.

DISCLOSURE OF INVENTION

In a first aspect, the invention is a method for relaying signals at a relay node in a wireless network comprising a source node, a destination node and one or more relay nodes; the method comprising the steps of:
receiving a signal from a first node;
decoding the received signal; and
if the received signal is decoded incorrectly, employing an Amplify-And-Forward (AAF) relaying protocol comprising the steps of amplifying the received signal and then transmitting the amplified signal to a second node; but otherwise,
employing a Decode-And-Forward (DAF) relaying protocol comprising the steps of re-encoding the decoded signal and then transmitting the coded signal to the second node.

The first node may be a source node or relay node. The second node may be a relay node or a destination node.

The received signal may be amplified by an amplification factor that varies according to the transmit power constraint of the relay node and the power of the signal received from the first node.

The DAF relaying protocol may further comprise the step of interleaving the coded signal before transmitting it to the second node The method may further comprise the steps of receiving a control signal from the second node after an initial signal transmission to the second node; the control signal informing the relay node to either continue or stop relaying signals from the first node to the second node.

The relay node may further receive a control signal from the second node after an initial signal transmission to the second node; and depending on the control signal, the relay node may continue or stop relaying the signal received from the first node to the second node. Using this relay-selection protocol, the second node may select the best relay node to relay signals from the first node.

In a second aspect, the invention is a method for processing signals at a destination node in a wireless relay network comprising a source node, a destination node and one or more relay nodes; the method comprising the steps of:
receiving a signal containing data from the source node;
receiving signals from one or more relay nodes, where each relay node either employs an Amplify-And-Forward (AAF) relaying protocol or a Decode-And-Forward (DAF) relaying protocol depending on whether the relay node can correctly decode a signal received from the source node;
recovering data transmitted by the source node by combining all signals received from the source and relay nodes and then decoding the combined signal.

The received signals may be combined so as to maximise the Signal-to-Noise Ratio (SNR) of the combined signal.

The combined signal may then be decoded using a Viterbi decoding algorithm.

A cyclic redundancy check (CRC) may be performed to determine whether a signal has been successfully decoded at the relay node. At the source transmitter CRC bits are appended to each block of information bits (a frame). At each relay the decoded CRC bits can be checked for errors.

During an initial transmission cycle between each relay node and the destination node, the method may further comprise the steps of:
determining the Signal-to-Noise Ratio (SNR) of the channel between the destination node and each relay node;
determining the best relay node, that is a relay node that has the maximum SNR at the destination node;
and transmitting a control signal to all relay nodes; the control signal informing the best relay node to continue relaying and informing other relay nodes to stop relaying.

The control signal may be transmitted to each relay node via a feedback channel or a reverse broadcast channel. After the initial transmission cycle, only the best relay node will relay signal from the source node to the destination node, where the best relay node either employs an AAF or a DAF protocol.

It may be assumed, for the purposes of calculation, that the channel does not change during each frame, so the best relay may be selected for each frame of data.

The step of recovering data transmitted by the source node may comprise the steps of:
- determining the relaying protocol employed by each relay node;
- constructing a first signal by combining the received signal from the source node with amplified signals from relay nodes employing the AAF protocol;
- constructing a second signal by combining coded and interleaved signals from relay nodes employing the DAF protocol; and
- decoding the first and second signals using a turbo iterative decoding algorithm to recover data transmitted by the source node.

The above scheme is known as distributed turbo decoding with adaptive relaying, where the first and second signals form a distributed code In a third aspect, the invention is a relay system comprising:
- a source node to send signals containing coded data to a destination node and one or more relay nodes;
- one or more relay nodes to receive signals from the source node and depending on whether the received signal can be decoded correctly, to either employ an Amplify-And-Forward or a Decode-And-Forward protocol and transmit a signal to the destination node; and
- a destination node to receive signals from the source and relay nodes, to combine the signals received and to decode the combined signal in order to recover the data transmitted by the source node.

In another aspect, the invention is a software to implement the method for relaying signals at a relay node in a wireless relay network; the method as described above.

In a further aspect, the invention is a software to implement the method for processing signals at a destination node in a wireless relay network; the method as described above.

The invention takes advantages of both the DAF and AAF protocols but minimise their negative affects. AAF-only protocols usually suffer from noise amplification while DAF-only protocols propagate error through imperfect decoding when channel quality from the source to the relay is poor. Using the invention, the relaying protocol is automatically adapted to the channel quality by simply switching between the AAF and the DAF without any need for the channel state information (CSI) to be fed back from the destination to the relays or the source. This is very important in practical relay networks, especially in a multi-hop large network, in which the feedback of CSI for adaptation is very expensive.

Additionally, adaptive relaying with relay selection facilitates system design for non-orthogonal channels and may improve system performance and capacity. By requiring only the signal from the relay having the best transmit Signal-to-Noise Ratio (SNR), other relays in the network do not have to relay the signal. Since channels may not be perfectly orthogonal in practice, this strategy reduces interference to the best relay, source and destination. Besides, other relays may conserve battery power by not having to relay signals when channel quality between the relays and the destination is poor.

Using distributed turbo coding with adaptive relaying, the overall received codeword at the destination consists of the combined coded information symbols received from the AAF relay group and the combined coded interleaved information symbols transmitted from the DAF relay group. When adaptive relaying and relay selection are combined with distributed turbo coding, the invention may provide not only SNR gain, but also coding gain due to the use of distributed turbo coding.

BRIEF DESCRIPTION OF THE DRAWINGS

An example of the invention will now be described with reference to the accompanying drawings, in which.

BEST MODES OF THE INVENTION

Figure 1:
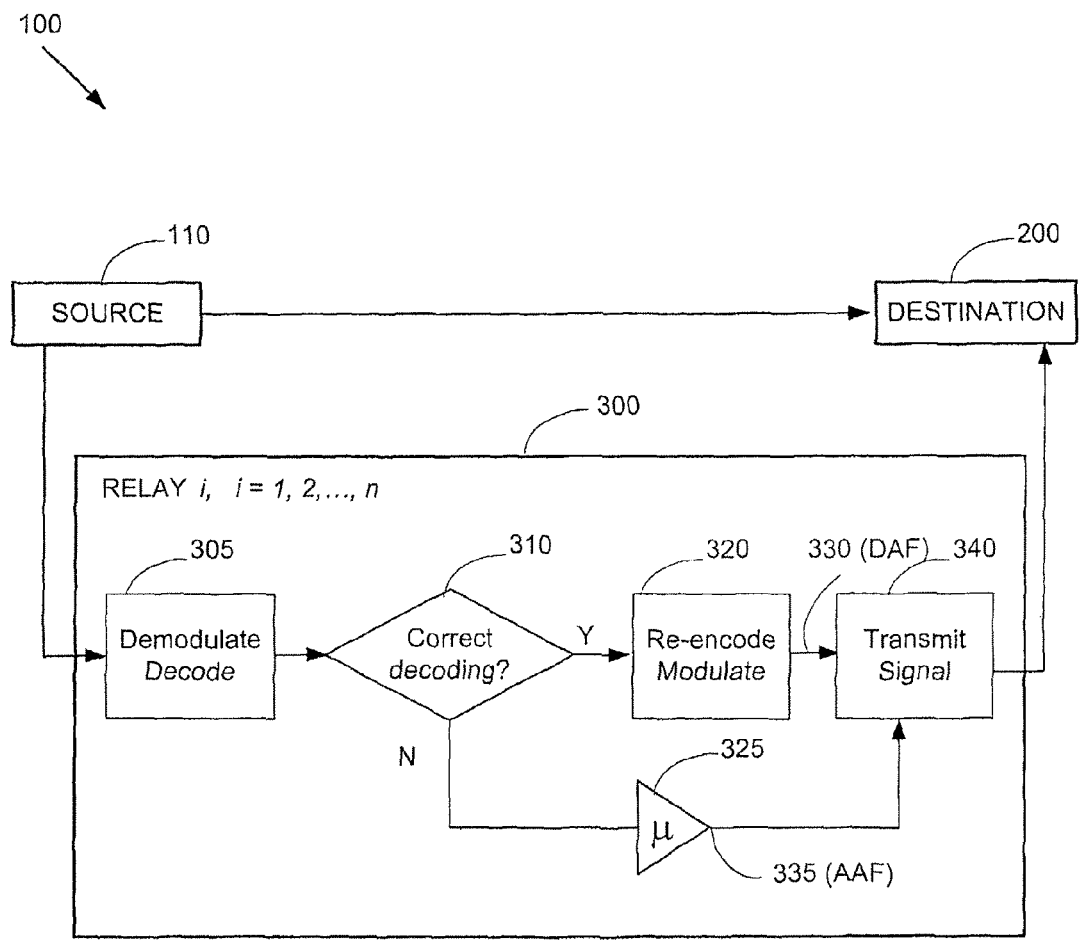
FIG. 1 is a block diagram of adaptive relaying protocol (ARP) in a 2-hop wireless relay network exemplifying the invention.

Referring first to FIG. 1, we consider a general 2-hop relay network 100, consisting of one source 110, n relays 300 and one destination 200 with a direct link from the source 110 to the destination 200. There may be more than one relay between the source 110 and the destination 200, forming a multi-hop network.

At the source 110, the transmitted source information binary stream, denoted by B, is represented by $$B=(b(1),\ldots,b(k),\ldots,b(l)) \quad (1)$$

where b(k) is a binary symbol transmitted at time k and l is the frame length.

The binary information sequence B is first encoded by a channel encoder. For simplicity, we consider a recursive systematic convolutional code (RSCC) with a code rate of 1/2. Let C represent the corresponding codeword, given by $$C=(C(1),\ldots C(k),\ldots,C(l)) \quad (2)$$

where $C(k)=(b(k), c(k)$, c(k) is the codeword of b(k), $c(k) \in \{0, 1\}$, b(k) is the information symbol and c(k) is the corresponding parity symbol.

The binary symbol stream C is then mapped into a modulated signal stream S. For simplicity, we consider a BPSK modulation. The modulated codeword, denoted by S, is given by:

$$S=(S(1),\ldots,S(l)) \quad (3)$$

where $S(k)=(s(k,1),s(k,2))$, $s(k,j)\in\{-1,+1\}$, $k=1,\ldots,l$, $j=1,2$, is the modulated signal transmitted by the source at time $2(k-1)+j$.

We assume that the source and relays transmit data through orthogonal channels. For simplicity, we will concentrate on a time division multiplex, for which the source and relays transmit in the separate time slots and all relays transmit to the destination at the same time. We also assume that the transmission channels for all relays are orthogonal, such that the transmitted signals from each relay can be separated at the destination without any interference from other relays.

The source first broadcasts the information to both the destination and relays. The received signals at the relay $i$, $i=1,\ldots,n$, and the destination, at time $2(k-1)+j$, denoted by $y_{sr,i}(k,j)$ and $y_{sd}(k,j)$, respectively, which can be expressed as:

$$y_{sr,i}(k,j)=\sqrt{P_{sr,i}}h_{sr,i}s(k,j)+n_{sr,i}(k,j) \quad (4)$$

$$y_{sd}(k,j)=\sqrt{P_{sd}}h_{sd}s(k,j)+n_{sd}(k,j) \quad (5)$$

where:
$P_{sr,i}=P_s(G_{sr,i})^2$, $P_{sd}=P_s(G_{sd})^2$ are the received signal power at the relay and destination, respectively; $P_s$ is the source transmit power, $$G_{sr,i}=\left(\frac{\lambda_c}{4\pi d_0}\right)\left(\frac{d_{sr,i}}{d_0}\right)^{-\kappa/2} \text{ and } G_{sd}=\left(\frac{\lambda_c}{4\pi d_0}\right)\left(\frac{d_{sd}}{d_0}\right)^{-\kappa/2}$$

are the channel gains between the source and the relay i and between the source and destination, respectively; $d_{sr,i}$ and $d_{sd}$ are the distances between the source and relay i, and that between the source and destination, respectively; $d_0$ is a reference distance; $\lambda_c$ is the carrier wavelength and $\kappa$ is a path loss factor with values typically in the range $1 \leq \kappa \leq 4$. Also, $h_{sr,i}$ and $h_{sd}$ are the fading coefficients between the source and relay i, and between the source and destination, respectively. They are modelled as zero-mean, independent circular symmetric complex Gaussian random variables.

We consider a quasi-static fading channel, for which the fading coefficients are constant within one frame and change independently from one frame to another. Furthermore, $n_{sr,i}(k,j)$ and $n_{sd}(k,j)$ are zero mean complex Gaussian random variables with two sided power spectral density of $N_0/2$ per dimension. We also assume that all noise processes are of the same variance without loss of generality. Different noise variances can be taken into account by appropriately adjusting the channel gain.

The relays 300 then process the received signals transmitted from the source and send them to the destination. Let $x_{r,i}(k,j)$ represent the signal transmitted from the relay i at time $2(k-1)+j$. It satisfies the following transmit power constraint, $$E(|x_{r,i}(k,j)|^2) \leq P_{r,i}$$

where $P_{r,i}$ is the transmitted power limit at the relay i.

The corresponding received signal at the destination 200 at time $2(k-1)+j$, denoted by $y_{rd,i}(k,j)$, can be written as $$y_{rd,i}(k,j)=G_{rd,i}h_{rd,i}x_{r,i}(k,j)+n_{rd,i}(k,j) \quad (6)$$

where $G_{rd,i}$ is the channel gain between the relay i and destination, $h_{rd,i}$ is the Gaussian complex fading coefficient between the relay i and destination and $n_{rd,i}(k,j)$ is a zero mean complex Gaussian random variable with two sided power spectral density of $N_0/2$ per dimension.

Adaptive Relaying Protocol (ARP)

FIG. 1 shows the operation of a relay 300 in detail. Upon receiving signals from the source 110, each relay decodes the received signal; step 305. In each transmission, based on whether relays can decode correctly or not, each relay is included into either of two groups, an AAF relay group 335 and a DAF relay group 330. All relays in the AAF relay group amplify the received signals from the source and forward it to the destination (325 and 340), while all the relays in the DAF relay group will decode the received signals, re-encode and forward them to the destination (320 and 340).

Amplify-And-Forward (AAF) Relay Group 335

An AAF relay group, denoted by $\Omega_{AAF}$, consists of all the relays, which could not decode correctly. Since each relay in the AAF relay group cannot decode correctly, upon receiving signal from the source, it will simply amplify the received signal from the source and forward it to the destination; 325 and 340 in FIG. 1. Let $x_{r,i}(k,j)$, $i\in\Omega_{AAF}$, represent the signal transmitted from the relay i at time $2(k-1)+j$, then it can be expressed as:

$$x_{r,i}(k,j)=\mu_i y_{sr,i}(k,j), \quad i\in\Omega_{AAF} \quad (7)$$

where $\mu_i$ is an amplification factor such that $$E(|\mu_i y_{sr,i}(k,j)|^2)=\mu_i^2(|h_{sr,i}|^2 P_{sr,i}+N_0) \leq P_{r,i}. \quad (8)$$

From (8), the amplification factor $\mu_i$ can be calculated as:

$$\mu_i \leq \sqrt{\frac{P_{r,i}}{|h_{sr,i}|^2 P_{sr,i}+N_0}} \quad (9)$$

By substituting (9) and (1) into (7), the received signals at the destination, at time $2(k-1)+j$, transmitted from the relay i, can be expressed as:

$$y_{rd,i}(k,j)=G_{rd,i}h_{rd,i}\mu_i(\sqrt{P_{sr,i}}h_{sr,i}s(k,j)+n_{sr,i}(k,j))+n_{rd,i}(k,j), \quad i\in\Omega_{AAF} \quad (10)$$

Decode-And-Forward (DAF) Relay Group 330

A DAF relay group, denoted by $\Omega_{DAF}$, consists of all the relays, which can decode successfully. Upon receiving signals from the source, each relay in the DAF relay group will decode the received signals from the source, re-encode and send them to the destination; 310 and 320 in FIG. 1.

Since all the relays in the DAF relay group can decode correctly, each relay in the DAF relay group can accordingly recover the binary information stream B. B is then encoded into C and modulated into S. The relay i in the DAF relay group will then forward the modulated symbols S with power $P_{r,i}$ to the destination; see 340 in FIG. 1, $$x_{r,i}(k,j)=\sqrt{P_{r,i}}s(k,j), \quad i\in\Omega_{DAF} \quad (11)$$

The received signals at the destination 200, transmitted from the relay i in the DAF relay group, become $$y_{rd,i}(k,j)=G_{rd,i}h_{rd,i}\sqrt{P_{r,i}}s(k,j)+n_{rd,i}(k,j), \quad i\in\Omega_{DAF} \quad (12)$$

Signal Processing at Destination 200

Figure 2:
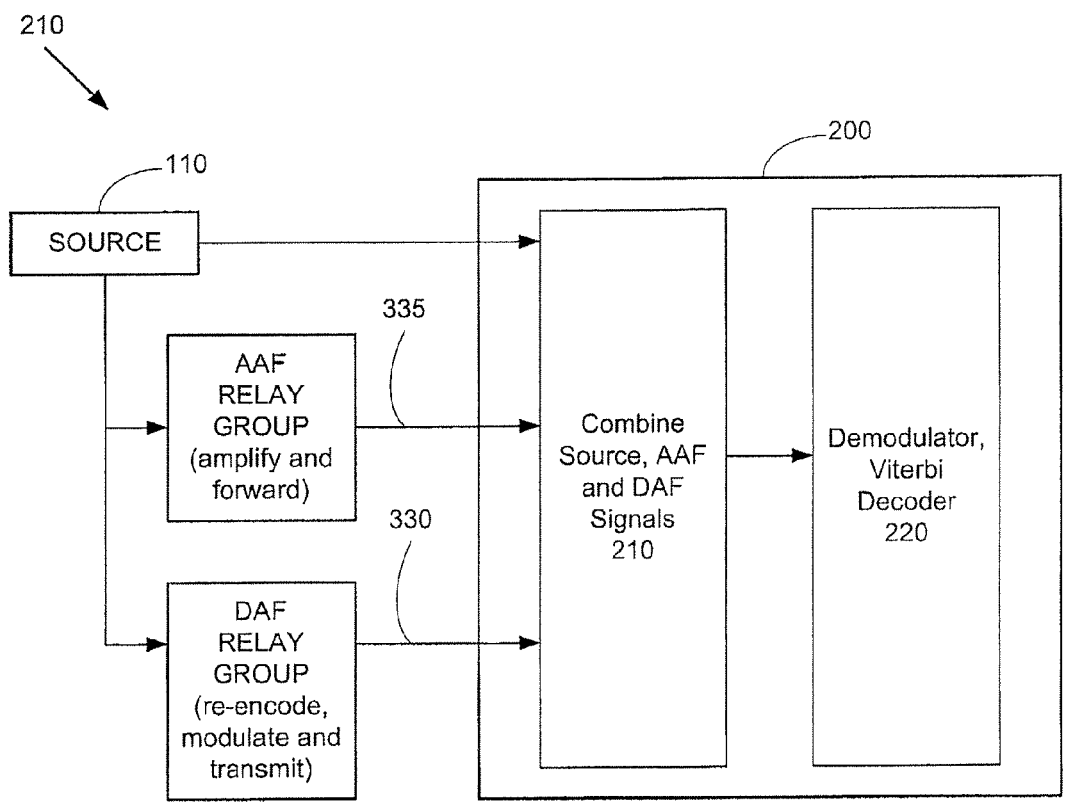
FIG. 2 is a detailed diagram of the operation at the destination in FIG. 1.

Referring now to FIG. 2, all signals received at the destination, forwarded from the source 110, the AAF 335 and DAF 330 groups, are combined into one signal as follows:

$$y_{rd-ARP}(k, j) = w_{sd}y_{sd}(k, j) + \sum_{i \in \Omega_{AAF}} w_{r,i}y_{rd,i}(k, j) + \quad (13)$$

$$\sum_{i \in \Omega_{DAF}} w_{r,i}y_{rd,i}(k, j)$$

$$= w_{sd}(\sqrt{P_{sd}}\, h_{sd}s(k, j) + n_{sd}(k, j)) +$$

$$\sum_{i \in \Omega_{AFF}} w_{r,i}\left(G_{rd,i}h_{rd,i}\mu_i\begin{pmatrix}\sqrt{P_{sr,i}}\, h_{sr,i}s(k, j) + \\ n_{sr,i}(k, j)\end{pmatrix} + \right) +$$

$$\sum_{i \in \Omega_{DAF}} w_{r,i}\left(h_{rd,i}\sqrt{P_{rd,i}}\, s(k, j) + n_{rd,i}(k, j)\right)$$

The destination SNR for the combined signals, denoted by $\epsilon_{ARP}$, can be calculated from (13) as $$\gamma_{ARP} = \frac{\left|\sqrt{P_{sd}}\, h_{sd}w_{sd} + \sum_{i \in \Omega_{AAF}} \sqrt{P_{sr,i}}\, \mu_i h_{rd,i} h_{sr,i} G_{rd,i} w_{r,i} + \right|^2}{\left(|w_{sd}|^2 + \sum_{i \in \Omega_{AAF}} |w_{r,i}|^2(|\mu_i h_{rd,i} G_{rd,i}|^2 + 1) + \sum_{i \in \Omega_{DAF}} |w_{r,i}|^2\right)N_0} \quad (14)$$

The above SNR can be maximized by taking partial derivatives relative to $w_{sd}$ and $w_{r,i}$, $i \in \Omega_{AAF}$, $i \in \Omega_{DAF}$ and their optimal values can be calculated as[1]:

[1] J. N. Laneman and G. W. Wornell, "Energy-efficient antenna sharing and relaying for wireless networks," in Proc. IEEE WCNC, 2000, pp. 7-12.

$$w_{sd} = \frac{\sqrt{P_{sd}}\, h_{sd}^*}{N_0}; \quad (15)$$

$$w_{r,i} = \frac{\mu_i G_{rd,i} \sqrt{P_{sr,i}}\, h_{rd,i}^* h_{sr,i}^*}{(\mu_i^2|G_{rd,i}|^2|h_{rd,i}|^2 + 1)N_0}, \, i \in \Omega_{AAF};$$

and $$w_{r,i} = \frac{h_{rd,i}^*\sqrt{P_{rd,i}}}{N_0}, \, i \in \Omega_{DAF}$$

Substitute (15) into (13), we have $$y_{rd,ARP}(k, j) = \frac{\sqrt{P_{sd}}\, h_{sd}^*}{N_0}(\sqrt{P_{sd}}\, h_{sd}s(k, j) + n_{sd}(k, j)) + \quad (16)$$

$$\sum_{i \in \Omega_{AAF}} \frac{\mu_i G_{rd,i}\sqrt{P_{sr,i}}\, h_{rd,i}^* h_{sr,i}^*}{(\mu_i^2|G_{rd,i}|^2|h_{rd,i}|^2 + 1)N_0}$$

$$\left(G_{rd,i}h_{rd,i}\mu_i\begin{pmatrix}\sqrt{P_{sr,i}}\, h_{sr,i}s(k, j) + \\ n_{sr,i}(k, j)\end{pmatrix} + \right) +$$

$$n_{rd,i}(k, j)$$

$$\sum_{i \in \Omega_{DAF}} \frac{\sqrt{P_{rd,i}}\, h_{rd,i}^*}{N_0}\left(h_{rd,i}\sqrt{P_{rd,i}}\, s(k, j) + n_{rd,i}(k, j)\right)$$

$$= \left(\frac{P_{sd}|h_{sd}|^2}{N_0} + \sum_{i \in \Omega_{AAF}} \frac{\mu_i^2|G_{rd,i}|^2 P_{sr,i}|h_{rd,i}|^2|h_{sr,i}|^2}{(\mu_i^2|G_{rd,i}|^2|h_{rd,i}|^2 + 1)N_0} + \sum_{i \in \Omega_{DAF}} \frac{P_{rd,i}|h_{rd,i}|^2}{N_0}\right)$$

$$s(k, j) + n_{rd,ARP}(k, j)$$

$$= A_{ARP}s(k, j) + n_{rd,ARP}(k, j)$$

where:

$$A_{ARP} = \quad (17)$$

$$\frac{P_{sd}|h_{sd}|^2}{N_0} + \sum_{i \in \Omega_{AAF}} \frac{\mu_i^2|G_{rd,i}|^2 P_{sr,i}|h_{rd,i}|^2|h_{sr,i}|^2}{(\mu_i^2|G_{rd,i}|^2|h_{rd,i}|^2 + 1)N_0} + \sum_{i \in \Omega_{DAF}} \frac{P_{rd,i}|h_{rd,i}|^2}{N_0}$$

and $$n_{rd,AAF}(k, j) = \frac{\sqrt{P_{sd}}\, h_{sd}^*}{N_0} n_{sd}(k, j) + \sum_{i \in \Omega_{AAF}} \frac{\mu_i G_{rd,i}\sqrt{P_{sr,i}}\, h_{rd,i}^* h_{sr,i}^*}{(\mu_i^2|G_{rd,i}|^2|h_{rd,i}|^2 + 1)N_0}$$

$$(G_{rd,i}h_{rd,i}\mu_i n_{sr,i}(k, j) + n_{rd,i}(k, j)) +$$

$$\sum_{i \in \Omega_{DAF}} \frac{\sqrt{P_{rd,i}}\, h_{rd,i}^*}{N_0} n_{rd,i}(k, j)$$

is an equivalent noise after the combination, with a zero mean and a variance of $\sigma_{rd,ARP}^2 = A_{ARP}$.

From Equation (17), we can then calculate the received SNR for the combined signals as follows, $$y_{ARP} = A_{ARP}. \quad (18)$$

By substituting (9) into (17), $y_{ARP}$ can further approximated by $$\gamma_{ARP} \leq \frac{P_{sd}|h_{sd}|^2}{N_0} + \quad (19)$$

$$\sum_{i \in \Omega_{AAF}} \frac{P_{r,i}|G_{rd,i}|^2 P_{sr,i}|h_{rd,i}|^2|h_{sr,i}|^2}{\left(\begin{matrix}P_{r,i}|G_{rd,i}|^2|h_{rd,i}|^2 + \\ |h_{sr,i}|^2 P_{sr,i} + N_0\end{matrix}\right)N_0} + \sum_{i \in \Omega_{DAF}} \frac{P_{rd,i}|h_{rd,i}|^2}{N_0} <$$

$$\frac{P_{sd}|h_{sd}|^2}{N_0} + \frac{1}{2}\sum_{i \in \Omega_{AAF}}\left(\frac{1}{2}\sum_{p=1}^{2}\frac{1}{\lambda_{i,p}}\right)^{-1} + \sum_{i \in \Omega_{DAF}} \frac{P_{rd,i}|h_{rd,i}|^2}{N_0} =$$

$$\gamma_{sd}|h_{sd}|^2 + \frac{1}{2}\sum_{i \in \Omega_{AAF}} H_2^i + \sum_{i \in \Omega_{DAF}} \gamma_{rd,i}|h_{rd,i}|^2$$

where $$\gamma_{sd} = \frac{P_{sd}}{N_0}, \lambda_{i,1} = |h_{sr,i}|^2 \gamma_{sr,i}, \lambda_{i,2} = \gamma_{rd,i}|h_{rd,i}|^2,$$

$$\gamma_{sr,i} = \frac{P_{sr,i}}{N_0},$$

$$\gamma_{rd,i} = \frac{P_{rd,i}}{N_0} P_{rd,i} = P_{r,i}|G_{rd,i}|^2 \text{ and } H_2^i = \left(\frac{1}{2}\sum_{p=1}^{2}\frac{1}{\lambda_{p,i}}\right)^{-1}$$

is called the Harmonic Mean of $\lambda_{i,p}$, p=1, 2.

After combining signals as in equation (16), a Viterbi decoding algorithm can then be used to obtain information estimates; see 220 in FIG. 2. The branch metrics of the Viterbi decoding algorithm is calculated as:

$$\sum_{k=1}^{l}\sum_{j=1}^{2} |y_{rd,ARP}(k, j) - A_{ARP}s(k, j)|^2 \quad (20)$$

Performance Analysis of ARP

Calculation of the traditional union bound requires knowing the code distance spectrum, which needs an exhaustive search of the code trellis. Due to a high complexity of this search, we consider an average upper bound. For simplicity of calculation, we assume that $y_{sr,i} = y_{sr}$ and $y_{rd,i} = y_{rd}$ for all i=1, ..., n.

(1) Error Probability of the ARP

Let us first calculate the pairwise error probability (PEP) for a scenario where the AAF relay group consists of q relays numbered from 1 to q and the DAF relay group consists of (n−q) relays numbered from (q+1) to n.

Let $y_{AAF,(q)}$ and $y_{DAF,(n-q)}$ represent the instantaneous received SNR of the combined signals in the AAF and DAF relay groups. For simplicity, we include the destination signal directly transmitted from the source into the AAF relay group, then we have the following from Equation (19):

$$\gamma_{AAF,q} = \frac{P_{sd}|h_{sd}|^2}{N_0} + \frac{1}{2}\sum_{i=1}^{q} H_2^i \quad (21)$$

$$\gamma_{DAF,(n-q)} = \gamma_{rd} \sum_{i=q+1}^{n} |h_{rd,i}|^2 \quad (22)$$

The conditioned pairwise error probability (PEP) that the decoder decides in favour of another erroneous codeword with Hamming weight $d_1$, for the above scenario, is given by:

$$P_{(q)}(d_1|h_{sd},h_{sr},h_{rd}) = Q(\sqrt{2d_1\gamma_{AAF,q}+2d_1\gamma_{DAF,(n-q)}}) \quad (23)$$

where Q(x) denotes the Q function.

The PEP can be derived by averaging Equation (23) over the fading coefficients. Let $P_{(q)}(d_1)$ be the PEP of decoding an erroneous code sequence with weight $d_1$, then we have $$P_{(q)}(d_1) = E(P_{(q)}(d_1 \mid h_{sd}, h_{sr}, h_{rd})) \quad (24)$$

$$= E\left(Q\left(\sqrt{2d_1\gamma_{AAF,q} + 2d_1\gamma_{DAF,(n-q)}}\right)\right)$$

$$= E\left(Q\left(\sqrt{2d_1\gamma_{AAF,q}}\right)Q\left(\sqrt{2d_1\gamma_{DAF,(n-q)}}\right)\right) \leq (d_1\gamma_{sd})^{-1}$$

$$E\left(Q\left(\sqrt{d_1\sum_{i=1}^{q} H_2^i}\right)\right) E\left(Q\left(\sqrt{2d_1\gamma_{rd}\sum_{i=q+1}^{n}|h_{rd,i}|^2}\right)\right)$$

Since all $H_2^i$, i=1, . . . , q are independent variables and $|h_{rd,i}|^2$ i=1, . . . , n are also independent to each other, the inequality (24) can be further written as:

$$P_{(q)}(d_1) \leq \frac{1}{2}(d_1\gamma_{sd})^{-1}\prod_{i=1}^{q} f_{(i)}(d_1) E\left(\prod_{i=q+1}^{n} Q(\sqrt{2d_1\gamma_{rd}|h_{rd,i}|^2})\right) = \quad (25)$$

$$(d_1\gamma_{sd})^{-1} f_q(d_1)(d_1\gamma_{rd})^{-(n-q)}$$

where:

$$f_q(d_1) = \prod_{i=1}^{q} f_{(i)}(d_1) \quad (26)$$

$$f_{(i)}(d_1) = E(Q(\sqrt{d_1 H_2^i})) = \int Q(\sqrt{d_1 H_2^i}) p(H_2^i) d(H_2^i)$$

and
$p(H_2^i)$ is the pdf of $H_2^i$, given by:

$$p(H_2^i) = \frac{2H_2^i \exp\left(-H_2^i\left(\frac{1}{\gamma_{sr}}+\frac{1}{\gamma_{rd}}\right)\right)}{\gamma_{sr}\gamma_{r-d}} \left[\frac{\gamma_{sr}+\gamma_{rd}}{\sqrt{\gamma_{sr}\gamma_{rd}}} K_1\left(\frac{2H_2^i}{\sqrt{\gamma_{sr}\gamma_{rd}}}\right) + 2K_0\left(\frac{2H_2^i}{\sqrt{\gamma_{sr}\gamma_{rd}}}\right)\right] \quad (27)$$

where $K_0(x)$ and $K_1(x)$ are the zero- and first-order modified Bessel function of the second kind.

The closed form expression of $f_{(i)}(d_1)$ can be calculated by using the moment generating function (MDF) of the Harmonic mean of two exponential random variables. The exact closed form expression of $f_{(i)}(d_1)$ is too complex to be presented it here. At high SNR, $f_i(d_1)$ can be approximated as:

$$f_{(i)}(d_1) = \left(\frac{1}{\gamma_{sr}} + \frac{1}{\gamma_{rd}}\right)(d_1)^{-1}. \quad (28)$$

By substituting (28) into (25), we have:

$$P_{(q)}(d_1) \leq (\gamma_{sd})^{-1}\left(\frac{1}{\gamma_{sr}}+\frac{1}{\gamma_{rd}}\right)^q (\gamma_{rd})^{-(n-q)}(d_1)^{-(n+1)} \quad (29)$$

Let $P_{F,sr}(d_{sr},y_{sr,i}|h_{sr,i})$ be the conditional pair-wise error probability (PEP) of incorrectly decoding a codeword into another codeword with Hamming distance of $d_{sr}$ in the channel from the source to the relay i. Since we assume that $y_{sr,i}=y_{sr}$ for all i=1, 2, . . . , n, then we have:

$$P_{F,sr}(d_{sr},y_{sr}|h_{sr,i}) = Q(\sqrt{2d_{sr}y_{sr}|h_{sr,i}|^2}) \quad (30)$$

Let $P_{F,sr}$ represent the average upper bound for word error probability in the channel from the source to the relay:

$$P_{F,sr} = \sum_{d_{sr}=d_{sr,min}}^{2l} \bar{A}(d_{sr}) E(P_{F,sr}(d_{sr}, \gamma_{sr} \mid h_{sr,i})) \quad (31)$$

$$= \frac{1}{\gamma_{sr}} \sum_{d_{sr}=d_{sr,min}}^{2l} \bar{A}(d_{sr}) \frac{1}{d_{sr}}$$

where $d_{sr,min}$ is the minimum code Hamming distance, $$\bar{A}(d_{sr}) = \sum_{i=1}^{l} \binom{l}{i} p(d_{sr} \mid i), \binom{l}{i}$$

is the number of words with Hamming weight i and $p(d_{sr}|i)$ is the probability that an input word with Hamming weight i produces a codeword with Hamming weight $d_{sr}$.

Due to the uniform distribution of the relays and assumption of $y_{sr,i}=y_{sr}$ and $y_{rd,i}=y_{rd}$ for all i=1, . . . , n, the probability that the AAF relay group consists of any q relays and the DAF relay group consists of the rest (n−q) relays is the same and is given by:

$$p_d = \binom{n}{q}(P_{F,sr})^q (1 - P_{F,sr})^{n-q} \quad (32)$$

where $\binom{n}{q} = \frac{n!}{q!(n-q)!}$.

Then the average PEP at high SNR can be calculated as:

$$P^{ARP}(d_1) \lesssim \sum_{q=0}^{n} p_q P_{(q)}(d_1) \leq \sum_{q=0}^{n} \binom{n}{q} (P_{F,sr})^q \quad (33)$$

$$(1-P_{F,sr})^{n-q} (\gamma_{sd})^{-1} \left(\frac{1}{\gamma_{sr}} + \frac{1}{\gamma_{rd}}\right)^q (\gamma_{rd})^{-(n-q)} (d_1)^{-(n+1)} =$$

$$(\gamma_{sd})^{-1} (\gamma_{rd})^{-n} (d_1)^{-(n+1)} \left[\frac{\gamma_{rd}}{\gamma_{sr}} P_{F,sr} + 1\right]^n.$$

where $x \lesssim y$ means that x is less than or equal to y at very high probability.

Similarly, for a perfect DAF, in which all relay are assumed to decode correctly, the average PEP of incorrectly decoding to a codeword with weight $d_1$, denoted by $P_{DAF}^{Perfect}$, can be calculated as:

$$P_{DAF}^{Perfect}(d_1) = E\left(Q\left(\sqrt{2d_1 \gamma_{sd}|h_{sd}|^2 + 2d_1 \gamma_{rd} \sum_{i=1}^{n} |h_{rd,i}|^2}\right)\right) \quad (34)$$

$$= E\left(Q\left(\sqrt{2d_1 \gamma_{sd}|h_{sd}|^2}\right) Q\left(\sqrt{2d_1 \gamma_{rd} \sum_{i=1}^{n} |h_{rd,i}|^2}\right)\right) \leq$$

$$(\gamma_{sd})^{-1} (\gamma_{rd})^{-n} (d_1)^{-(n+1)}$$

Equation (33) can be further expressed as:

$$P^{ARP}(d_1) \lesssim \left[\frac{\gamma_{rd}}{\gamma_{sr}} P_{F,sr} + 1\right]^n P_{DAF}^{Perfect}(d_1) = \quad (35)$$

$$G_{ARP} P_{DAF}^{Perfect}(d_1) > (1 + P_{F,sr})^n P_{DAF}^{Perfect}(d_1)$$

where $$G_{ARP} = \left(P_{F,sr} \frac{\gamma_{rd}}{\gamma_{sr}} + 1\right)^n > (1 + P_{F,sr})^n > 1 \quad (36)$$

represents the BER increase of the ARP compared to the perfect DAF under the same SNR.

It can be noted that as $y_{sr} \to \infty$, $P_{F,sr} \to 0$, $G_{ARP} \to 1$, $P^{ARP}(d_1) \to P_{DAF}^{Perfect}(d_1)$ and the performance of the ARP approaches the perfect DAF.

Let $P_b^{ARP}$ be the average upper bound on the bit error rate (BER) for the ARP. At high SNR, $P_b^{ARP}$ can be approximated as $$P_b^{ARP} \leq \sum_{d_1=d_{min}}^{4l} \sum_{j=1}^{l} \frac{j}{l} \binom{l}{j} \overline{A}(d_1) p^{ARP}(d_1) \approx \quad (37)$$

$$\sum_{d_1=d_{min}}^{4l} \sum_{j=1}^{l} \frac{j}{l} \binom{l}{j} \overline{A}(d_1) \left[\left(\frac{\gamma_{rd}}{\gamma_{sr}} + 1\right) P_{F,sr} + 1\right]^n P_{DAF}^{Perfect}(d_1) =$$

$$(\gamma_{sd})^{-1} (\gamma_{rd})^{-n} \sum_{d_1=d_{min}}^{4l} \sum_{j=1}^{l} \rho_j(d_1).$$

where:

$$\rho_j(d_1) = \frac{j}{l} \binom{l}{j} \overline{A}(d_1) \left[\frac{\frac{1}{\gamma_{sr}}\left(\frac{2\gamma_{rd}}{\gamma_{sr}} + 1\right)}{\left(\sum_{d_{sr}=d_{sr,min}}^{2l} \overline{A}(d_{sr}) \frac{1}{d_{sr}}\right) + 1}\right]^n (d_1)^{-(n+1)}, \quad (38)$$

$$\overline{A}(d_1) = \sum_{i=1}^{l} \binom{l}{i} p(d_1 | i) \text{ and } \binom{l}{i}$$

is the number of words with Hamming weight i and $p(d_1|i)$ is the probability that an input word with Hamming weight i produces a codeword with Hamming weight d.

From equations (37-38), we can observe that a diversity order of (n+1) can be achieved for an ARP scheme in a relay network with n relays at a higher $y_{sr}$ region.

(2) Error Probability of the AAF

Following the similar analysis, the average PEP of the AAF of incorrectly decoding to a codeword with weight d, denoted by $P^{AAF}(d)$, can be similarly calculated as $$P^{AAF}(d_1) = Q\left(\sqrt{2d_1 \gamma_{AAF,n}}\right) \leq (d_1 \gamma_{sd})^{-1} E\left(Q\left(\sqrt{d_1 \sum_{i=1}^{n} H_2^i}\right)\right) \quad (39)$$

$$= (\gamma_{sd})^{-1} \left(\frac{1}{\gamma_{sr}} + \frac{1}{\gamma_{rd}}\right)^n (d_1)^{-(n+1)}$$

Compared to $P^{AAF}(d_1)$, the average PEP of the ARP in Equation (33) can also be expressed as $$P^{ARP}(d_1) \lesssim \left(\frac{\sum_{q=0}^{n} \binom{n}{q} (P_{F,sr})^q (1-P_{F,sr})^{n-q}}{\left(\frac{\gamma_{sr}}{\gamma_{rd} + \gamma_{sr}}\right)^{(n-q)}}\right) P^{AAF}(d_1) = \quad (40)$$

$$\left(\frac{1 - P_{F,sr}}{\gamma_{rd}/\gamma_{sr} + 1} + P_{F,sr}\right)^n P^{AAF}(d_1) = G_{ARP/AAF} P^{AAF}(d_1)$$

where $$G_{ARP/AAF} = \left(1 - \frac{1 - P_{F,sr}}{\gamma_{sr}/\gamma_{rd} + 1}\right)^n < 1 \quad (41)$$

represents the BER reduction of the ARP over the AAF under the same SNRs.

It can be easily proved from Equation (41) that for high $y_{rd}$ value, $G_{ARP/AAF}$ is a decreasing function of $y_{sr}$. Therefore $G_{ARP/AAF}$ decreases as $y_{sr}$ increases, and the ARP can achieve a considerable error rate reduction compared to the AAF under the same $y_{sr}$ and $y_{rd}$ values. This error rate reduction exponentially grows as the number of relays increases.

Relay Selection Algorithm with Adaptive Relay Protocol (RS-ARP)

Figure 3:
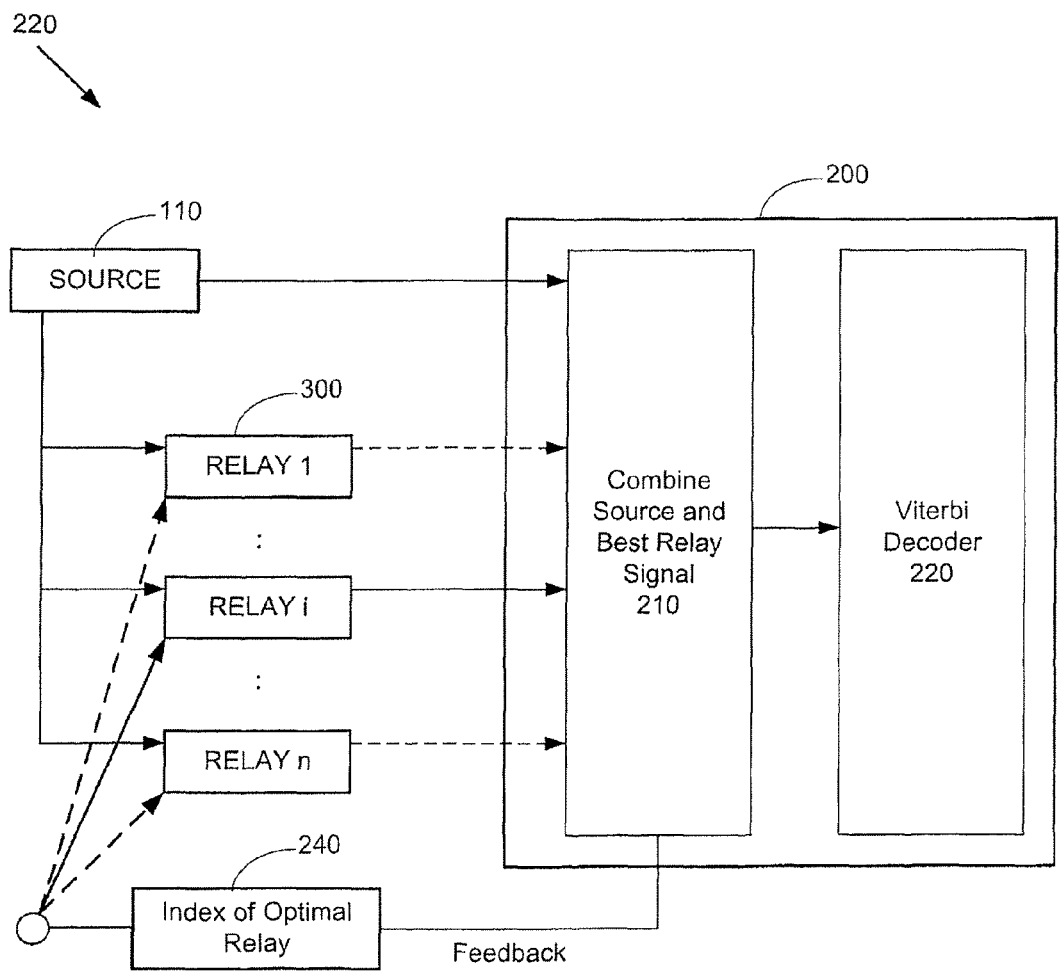
FIG. 3 is a block diagram of adaptive relaying protocol with relay selection (RS-ARP).

As shown in FIG. 3, adaptive relaying may be combined with relay selection. Similarly, each relay i 300, i=1, . . . , n, is either in the AAF relay group or the DAF relay group.

However, after receiving signals from all relays, the destination will first calculate the received SNR for each relay in both AAF and DAF groups. From Equation (10), the destination SNR for i-th relay in the AAF group can be calculated as, $$\gamma_{AAF,i} = \frac{(G_{rd,i})^2 P_{sr,i} |h_{sr,i} h_{rd,i} \mu_i|^2}{(|G_{rd,i} h_{rd,i} \mu_i|^2 + 1) N_0} \quad (42)$$

$$= \frac{(G_{rd,i})^2 P_{sr,i} P_{r,i} |h_{sr,i} h_{rd,i}|^2}{(|G_{rd,i} h_{rd,i}|^2 P_{r,i} + |h_{sr,i}|^2 P_{sr,i} + N_0) N_0}$$

$$= \frac{\gamma_{sr,i} \gamma_{rd,i} |h_{sr,i} h_{rd,i}|^2}{|h_{rd,i}|^2 \gamma_{rd,i} + |h_{sr,i}|^2 \gamma_{sr,i} + 1}$$

where $i \in \Omega_{AAF}$ and $\gamma_{sr,i} = \frac{P_{sr,i}}{N_0}$, $$\gamma_{rd,i} = \frac{P_{rd,i}}{N_0},$$

$$P_{rd,i} = P_{r,i} |G_{rd,i}|^2.$$

Similarly, from Equation (12), the destination SNR for j-th relay in the DAF group can be calculated as:

$$y_{DAF,j} = |h_{rd,j}|^2 y_{rd,j}, \; j \in \Omega_{DAF} \quad (43)$$

Among all relays in both AAF and DAF groups, the destination will select one relay, denoted by S, which has the maximum destination SNR, $$S = \underset{i,j}{\text{Max}}\{\gamma_{AAF,i}, i \in \Omega_{AAF}; \gamma_{DAF,j}, j \in \Omega_{DAF}\} \quad (44)$$

After finding the optimum relay S, through a feedback channel or a reverse broadcast channel, the destination will inform which relay is selected for transmission and other unselected relays will be in an idle state. For example, if the ith relay has the best SNR at the destination, the "index of optimal relay" will be set to i, requiring only the selected relay to relay the signal from the source 110; see 240 in FIG. 3. The dashed arrows in FIG. 3 represent communications with non-selected relays.

If the selected relay S is from the AAF relay group, it will amplify and forward the received signal transmitted from the source and if it is selected from the DAF group, it will decode and forward the received signals. At destination, Viterbi decoding can then be used to obtain the information estimates.

Performance Analysis of RS-ARP

In this section, we analyze the performance of the RS-ARP. For simplicity of calculation, we assume that $y_{sr,i} = y_{sr}$ and $y_{rd,i} = y_{rd}$ for all i=1, . . . , n.

(1) Error Probability of the RS-ARP

We first calculate the pairwise error probability (PEP) of RS-ARP for a scenario where the AAF relay group consists of q relays numbered from 1 to q and the DAF relay group consists of (n−q) relays numbered from (q+1) to n.

Let $y_{AAF,(q)}^{max}(k)$ and $y_{DAF,(n-q)}^{max}(k)$ represent the received destination signals, at time k, with the maximum instantaneous received SNRs, in the AAF and DAF, respectively. Also, let $y_{AAF,(q)}^{max}$ and $y_{DAF,(n-q)}^{max}$ represent the corresponding SNR, then $$\gamma_{AAF,(q)}^{max} = \underset{i}{\text{Max}}\{\gamma_{AAF,i}, i = 1, \ldots, q\} \quad (45)$$

$$\gamma_{DAF,(n-q)}^{max} = \underset{i}{\text{Max}}\{\gamma_{DAF,i}, i = q+1, \ldots, n\} \quad (46)$$

Let $y_{AAF-D,(q)}^{max}(k)$ and $y_{DAF-D,(n-q)}^{max}(k)$ denote the signals after combining $y_{AAF,(q)}^{max}(k)$ and $y_{DAF,(n-q)}^{max}(k)$ with the $y_{sd}(k)$ at the destination, with corresponding SNR $y_{AAF-D,(q)}^{max}$ and $y_{DAF-D,(n-q)}^{max}$, respectively, then we have $$y_{AAF-D,(q)}^{max}(k) = w_{sd} y_{sd}(k) + w_{AAF}^{max} y_{AAF,(q)}^{max}(k) \quad (47)$$

$$y_{DAF-D,(q)}^{max}(k) = w_{sd} y_{sd}(k) + w_{DAF}^{max} y_{DAF,(q)}^{max}(k) \quad (48)$$

where the optimum combining coefficient can be calculated as:

$$w_{sd} = \frac{\sqrt{P_{sd}} h_{sd}^*}{N_0}, \quad (49)$$

$$w_{AAF}^{max} = \frac{\mu_{i_{A-max}} G_{rd,i_{A-max}} \sqrt{P_{sr,i_{A-max}}} h_{rd,i_{A-max}}^* h_{sr,i_{A-max}}^*}{(\mu_{i_{A-max}}^2 |G_{rd,i_{A-max}}|^2 |h_{rd,i_{A-max}}|^2 + 1) N_0},$$

and $$w_{DAF}^{max} = \frac{h_{rd,i_{D-max}}^* \sqrt{P_{rd,i_{D-max}}}}{N_0}$$

where $i_{A-max}$ and $i_{D-max}$ represent the relay with maximum destination SNR in the AAF and DAF groups, respectively.

After substituting Equation (49) into (47) and (48), $y_{AAF-D,(q)}^{max}$ and $y_{DAF-D,(n-q)}^{max}$ can be further calculated as $$y_{AAF-D,(q)}^{max} = y_{sd} |h_{sd}|^2 + y_{AAF,(q)}^{max} \quad (50)$$

$$y_{DAF-D,(n-q)}^{max} = y_{sd} |h_{sd}|^2 + y_{DAF,(n-q)}^{max} \quad (51)$$

where $$\gamma_{AAF,(q)}^{max} = \frac{|h_{sr,i_{A-max}}|^2 |h_{rd,i_{A-max}}|^2 \gamma_{sr} \gamma_{rd}}{|h_{sr,i_{A-max}}|^2 \gamma_{sr} + \gamma_{rd} |h_{rd,i_{A-max}}|^2 + 1}$$

and $$\gamma_{DAF,(n-q)}^{max} = \gamma_{rd} |h_{rd,i_{D-max}}|^2.$$

Let $Y = y_{AAF,(q)}^{max}$ and $Z = y_{DAF,(n-q)}^{max}$, then the PDF of $y_{AAF,(q)}^{max}$ can be approximated at high SNR as:

$$P_Y(y) \approx q(y_{sr}^{-1} + y_{rd}^{-1}) \exp(-y(y_{sr}^{-1} + y_{rd}^{-1}))[1 - \exp(-y(y_{sr}^{-1} + y_{rd}^{-1}))]^{q-1} \quad (52)$$

while the PDF of $y_{DAF,(n-q)}^{max}$ is given by:

$$P_Z(z) = \frac{(n-q)}{\gamma_{rd}} e^{-z/\gamma_{rd}} (1 - e^{-z/\gamma_{rd}})^{n-q-1} \quad (53)$$

Let $$y_{S,(q)}^{max} = \text{Max}\{y_{AAF-D,(q)}^{max}, y_{DAF-D,(n-q)}^{max}\} \quad (54)$$

represent the destination SNR of the optimal relay in both AAF and DAF groups at the destination. Then we have $$\gamma_{S,(q)}^{max} = \begin{cases} \gamma_{AAF-D,(q)}^{max} & \gamma_{AAF,(q)}^{max} \geq \gamma_{DAF,(n-q)}^{max} \\ \gamma_{DAF-D,(n-q)}^{max} & \gamma_{AAF,(q)}^{max} \leq \gamma_{DAF,(n-q)}^{max} \end{cases} \quad (55)$$

The conditioned pairwise error probability (PEP) that the decoder decides in favour of another erroneous codeword with Hamming weight $d_1$, for the above scenario, is given by:

$$P_{(q)}(d_1 \mid h_{sd}, h_{sr}, d_{rd}) = Q\left(\sqrt{2d_1 \gamma_{S,(q)}^{max}}\right) \quad (56)$$

$$= \begin{cases} Q\left(\sqrt{2d_1 \gamma_{AAF-D,(q)}^{max}}\right) & \gamma_{AAF,(q)}^{max} \geq \gamma_{DAF,(n-q)}^{max} \\ Q\left(\sqrt{2d_1 \gamma_{DAF-D,(n-q)}^{max}}\right) & \gamma_{AAF,(q)}^{max} \leq \gamma_{DAF,(n-q)}^{max} \end{cases}$$

The PEP can be derived by averaging Equation (20) over the fading coefficients. Let $P_{(q)}(d_1)$ be the PEP of decoding an erroneous code sequence with weight $d_1$, then we have:

$$P_{(q)}(d_1) = E(P_{(q)}(d_1 \mid h_{sd}, h_{sr}, h_{rd})) = E(Q(\sqrt{2d_1 \gamma_{S,(q)}^{max}})) \quad (57)$$

Let $X = |h_{sd}|^2$, then the PDF of X is given by $P_X(x) = \exp(-x)$ and Equation (57) can be further written as:

$$P_{(q)}(d_1) = \iiint Q\left(\sqrt{2d_1 \gamma_{S,(q)}^{max}}\right) P_X(x) P_Y(y) P_Z(z) dx\,dy\,dz \quad (58)$$

$$\leq \iiint \exp(-d_1 \gamma_{S,(q)}^{max}) P_X(x) P_Y(y) P_Z(z) dx\,dy\,dz$$

$$= \int_0^\infty \left( \int_0^y \int_0^\infty \exp[-d_1(\gamma_{sd} x + y)] P_X(x) P_Z(z) dx\,dz \right) P_Y(y) dy +$$

$$\int_0^\infty \left( \int_0^z \int_{0\infty}^\infty \exp[-d_1(\gamma_{sd} x + z)] P_X(x) P_Y(y) dx\,dy \right) P_Z(z) dz$$

$$= (d_1 \gamma_{sd})^{-1} \left( \int_0^\infty \exp(-d_1 y) \left( \int_0^y P_Z(z) dz \right) P_Y(y) dy + \int_0^\infty \exp(-d_1 z) \left( \int_0^z P_Y(y) dy \right) P_Z(z) dz \right)$$

$$= (d_1 \gamma_{sd})^{-1} q(\gamma_{sr}^{-1} + \gamma_{rd}^{-1}) \int_0^\infty \exp[-(d_1 + \gamma_{sr}^{-1} + \gamma_{rd}^{-1}) y]$$

$$(1 - e^{-y/\gamma_{rd}})^{n-q} [1 - \exp(-y(\gamma_{sr}^{-1} + \gamma_{rd}^{-1}))]^{q-1} dy +$$

$$(d_1 \gamma_{sd})^{-1} \frac{(n-q)}{\gamma_{rd}} \int_0^\infty \exp[-(d_1 + \gamma_{rd}^{-1}) z]$$

$$[1 - \exp(-z(\gamma_{sr}^{-1} + \gamma_{rd}^{-1}))]^q (1 - e^{-z/\gamma_{rd}})^{n-q-1} dz$$

By using the Taylor series, we have:

$$e^{-y/\gamma_{rd}} = \sum_{k=0}^\infty \frac{(-1)^k}{k!} (\gamma_{rd}^{-1})^k y^k \quad (59)$$

and $$e^{-y(\gamma_{sr}^{-1} + \gamma_{rd}^{-1})} = \sum_{k=0}^\infty \frac{(-1)^k}{k!} (\gamma_{sr}^{-1} + \gamma_{rd}^{-1})^k$$

At high SNR, $y_{rd}^{-1} \ll 1$ and $y_{rd}^{-1} \ll 1$, thus by ignoring the terms of second and higher order of y in the above series, Equation (59) can be further approximated as $$P_{(q)}(d_1) \leq (d_1 \gamma_{sd})^{-1} q(\gamma_{sr}^{-1} + \gamma_{rd}^{-1}) \quad (60)$$

$$\int_0^\infty \exp[-(d_1 + \gamma_{sr}^{-1} + \gamma_{rd}^{-1}) y] (y \gamma_{rd}^{-1})^{n-q} [y(\gamma_{sr}^{-1} + \gamma_{rd}^{-1})]^{q-1} dy +$$

$$(d_1 \gamma_{sd})^{-1} \frac{(n-q)}{\gamma_{rd}}$$

-continued $$\int_0^\infty \exp[-(d_1 + \gamma_{rd}^{-1}) z] [z(\gamma_{sr}^{-1} + \gamma_{rd}^{-1})]^q (z \gamma_{rd}^{-1})^{n-q-1} dz =$$

$$q(d_1 \gamma_{sd})^{-1} (\gamma_{rd}^{-1})^{n-q} [(\gamma_{sr}^{-1} + \gamma_{rd}^{-1})]^q$$

$$\int_0^\infty y^{n-1} \exp[-(d_1 + \gamma_{sr}^{-1} + \gamma_{rd}^{-1}) y] dy + (n-q)(d_1 \gamma_{sd})^{-1}$$

$$(\gamma_{sr}^{-1} + \gamma_{rd}^{-1})^q (\gamma_{rd}^{-1})^{n-q} \int_0^\infty z^{n-1} \exp[-(d_1 + \gamma_{rd}^{-1}) z] dz =$$

$$(d_1 \gamma_{sd})^{-1} (\gamma_{rd}^{-1})^{n-q} (\gamma_{sr}^{-1} + \gamma_{rd}^{-1})^q (n-1)!$$

$$(q(d_1 + \gamma_{sr}^{-1} + \gamma_{rd}^{-1})^{-n} + (n-q)(d_1 + \gamma_{rd}^{-1})^{-n}) \leq$$

$$(d_1 \gamma_{sd})^{-1} (\gamma_{rd}^{-1})^{n-q} (\gamma_{sr}^{-1} + \gamma_{rd}^{-1})^q (n)! (d_1)^{-n}$$

Let $p_q$ represent the probability that the AAF relay group consists of any q relays and the DAF relay group consists of the rest (n−q) relays and it is given by:

$$p_q = \binom{n}{q} (P_{F,sr})^q (1 - P_{F,sr})^{n-q} \quad (61)$$

where $P_{F,sr}$ the average upper bound for word error probability in the channel from the source to the relay, given by:

$$P_{F,sr} = \frac{1}{\gamma_{sr}} \sum_{d_{sr}=d_{sr,min}}^{2l} \overline{A}(d_{sr}) \frac{1}{d_{sr}} \quad (62)$$

where $d_{sr,min}$ is the code minimum Hamming distance, $$\overline{A}(d_{sr}) = \sum_{i=1}^l \binom{l}{i} p(d_{sr} \mid i),$$

and $p(d_{sr} \mid i)$ is the probability that an input word with Hamming weight i produces a codeword with Hamming weight $d_{sr}$.

Then the average PEP of the RS-ARP at high SNR can be approximated as $$P^{RS-ARP}(d_1) \leq \sum_{q=0}^n p_q P_{(q)}(d_1) \leq \sum_{q=0}^n \binom{n}{q} (P_{F,sr})^q \quad (63)$$

$$(1 - P_{F,sr})^{n-q} (d_1 \gamma_{sd})^{-1} (\gamma_{rd}^{-1})^{n-q} (\gamma_{sr}^{-1} + \gamma_{rd}^{-1})^q (n)! (d_1)^{-n} =$$

$$n!(d_1)^{-(n+1)} \gamma_{sd}^{-1} \sum_{q=0}^n \binom{n}{q} (P_{F,sr})^q (1 - P_{F,sr})^{n-q} (\gamma_{rd}^{-1})^{n-q} (\gamma_{sr}^{-1} + \gamma_{rd}^{-1})^q =$$

$$n!(d_1)^{-(n+1)} \gamma_{sd}^{-1} (P_{F,sr}(\gamma_{sr}^{-1} + \gamma_{rd}^{-1}) + (1 - P_{F,sr}) \gamma_{rd}^{-1})^n =$$

$$n!(d_1)^{-(n+1)} \gamma_{sd}^{-1} (P_{F,sr} \gamma_{sr}^{-1} + \gamma_{rd}^{-1})^n$$

From Equation (63), we can observe that a diversity order of (n+1) can be achieved for an RS-ARP scheme in a relay networks with n relays at a higher $y_{sr}$ region.

Similarly, for a perfect DAF-Selection, in which all relay are assumed to decode correctly, the average PEP of incorrectly decoding to a codeword with weight $d_1$, denoted by $P_{DAF-S}^{Perfect}$, can be calculated as:

$$P_{DAF-S}^{Perfect}(d_1) = E(Q(\sqrt{2d_1 y_{DAF-D,n}^{max}})) \leq n(y_{rd})^{-1}(d_1 y_{sd})^{-1} y_{rd} B((d_1 y_{rd}+1),n) \quad (64)$$

where $B(x,y)$ is a beta function.

At high SNR, it can be approximated as $$P_{DAF-S}^{Perfect}(d_1) \approx n!(d_1)^{-(n+1)} y_{sd}^{-1}(y_{rd})^{-n} \quad (65)$$

Equation (63) can be further expressed as:

$$P^{RS-ARP}(d_1) \lesssim \left[\frac{y_{rd}}{y_{sr}}P_{F,sr}+1\right]^n P_{DAF-S}^{Perfect}(d_1) = G_{RS-ARP} P_{DAF-S}^{Perfect}(d_1) \quad (66)$$

where $$G_{RS-ARP} = \left(\frac{y_{rd}}{y_{sr}}P_{F,sr}+1\right)^n > 1 \quad (67)$$

represents the BER increase of the RS-ARP compared to the perfect DAF-Selection under the same SNR.

It can be noted that as either $y_{sr} \to \infty$, $$P_{F,sr} \to 0 \text{ or } \frac{y_{rd}}{y_{sr}} \to 0,$$

$G_{RS-HRP} \to 1$, and the performance of the RS-ARP approaches the perfect DAF-Selection.

(2) Error Probability of the AAF-Selection

Following the similar analysis, for the AAF-Selection, the average PEP of incorrectly decoding to a codeword with weight $d_1$, denoted by $P^{AAF-S}(d_1)$, can be calculated at high SNR as:

$$P^{AAF-S}(d_1) = Q(\sqrt{2d_1 y_{AAF-D,n}^{max}}) \leq n!(d_1)^{-(n+1)} y_{sd}^{-1}(y_{sr}^{-1}+y_{rd}^{-1})^n \quad (68)$$

By comparing with $P^{AAF-S}(d_1)$, $P^{RS-ARP}(d_1)$ in Equation (63) can be further expressed as $$P^{RS-ARP}(d_1) \lesssim P^{AAF-S}(d_1) G_{RS-ARP/AAF-S} \quad (69)$$

where $$G_{RS-ARP/AAF-S} = \left(1 - \frac{(1-P_{F,sr})}{y_{sr}/y_{rd}+1}\right)^n < 1 \quad (70)$$

represents the BER reduction of the RS-ARP compared to the AAF-selection.

It can be proved that $G_{RS-ARP/AAF-S}$ is a decreasing function of $y_{sr}$ for high $y_{rd}$ values. Therefore for a fixed $y_{rd}$, $G_{RS-ARP/AAF-S}$ significantly decreases as $y_{sr}$ increases, and the RS-ARP can achieve a considerable error rate reduction compared to the AAF selection under the same SNR. This error rate reduction exponentially grows as the number of relays increases.

Distributed Turbo Coding with ARP (DTC-ARP)

Figure 4:
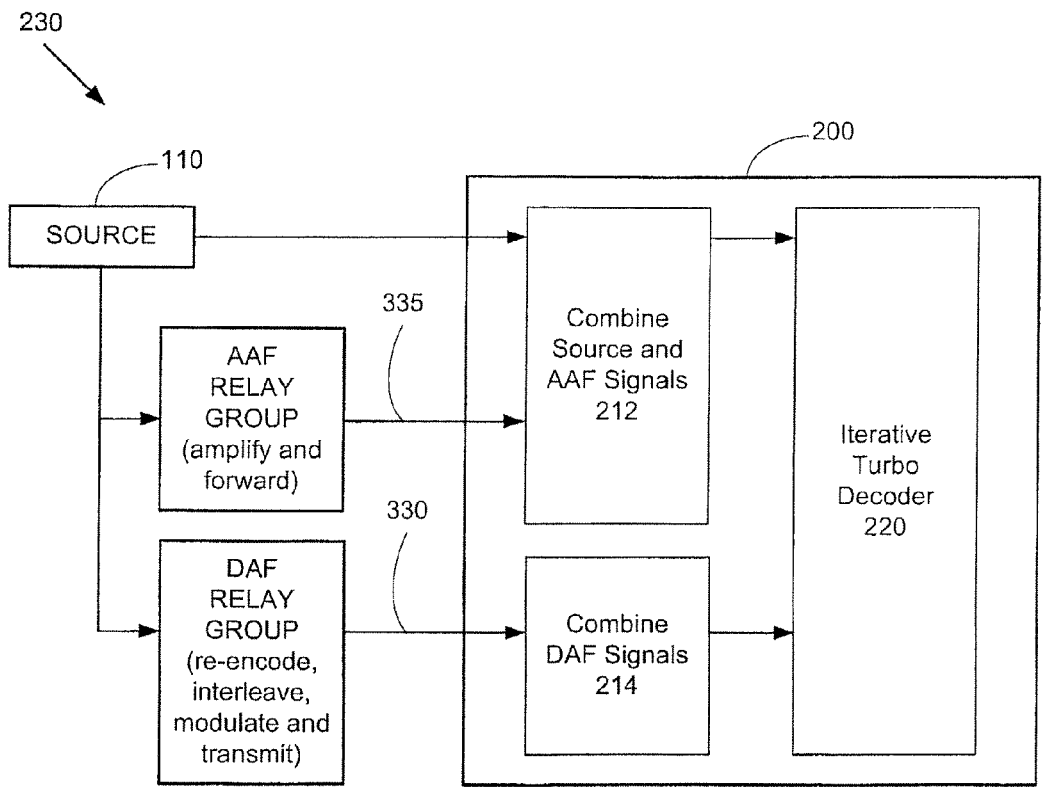
FIG. 4 is a block diagram of adaptive relaying protocol with distributed turbo decoding (DTC-ARP).

Referring now to FIG. 4, the adaptive relaying protocol (ARP) is combined with distributed turbo coding. Using this protocol, all the relays in the AAF relay group amplify the received signals from the source and forward them to the destination, while the relays in the DAF relay group decode the received signals, interleave the decoded symbols, re-encode and forward them to the destination.

Specifically, all signals forwarded from the AAF relay group, at time $2(k-1)+j$, are combined with the signals directly transmitted from the source (see 212 in FIG. 4), as follows, $$y_{rd,AAF}(k,j) = w_{sd} y_{sd}(k,j) + \sum_{i \in \Omega_{AAF}} w_{r,i} y_{rd,i}(k,j) \quad (71)$$
$$= A_{AAF} s(k,j) + n_{rd,AAF}(k,j)$$

where $y_{rd,AAF}(k,j)$ is the combined signal at time $2(k-1)+j$, $$A_{AAF} = \frac{P_{sd}|h_{sd}|^2}{N_0} + \sum_{i \in \Omega_{AAF}} \frac{\mu_i^2 |G_{rd,i}|^2 P_{sr,i}|h_{rd,i}|^2 |h_{sr,i}|^2}{(\mu_i^2 |G_{rd,i}|^2 |h_{rd,i}|^2 + 1)N_0} \quad (72)$$

and $\mu_i$ is an amplification factor given in (4) and $n_{rd,AAF}(k,j)$ is an equivalent noise after the combination, with a zero mean and a variance of $\sigma_{rd,AAF}^2 = A_{AAF}$.

Each relay in the DAF group decodes the received signals, interleaves the decoded symbols, re-encodes and transmits it to the destination. Let $\tilde{B}=(\tilde{b}(1),\ldots,\tilde{b}(k),\ldots,\tilde{b}(l))$ represent the interleaved version of B. Let $\tilde{C}=(\tilde{C}(1),\ldots,\tilde{C}(l))$ denote the codeword of $\tilde{B}$, where $\tilde{C}(k)=(\tilde{b}(k),\tilde{c}(k))$ is the codeword of $\tilde{b}(k)$. $\tilde{C}$ is then mapped into a modulated signal stream $\tilde{S}=(\tilde{S}(1),\ldots,\tilde{S}(l))$, where $\tilde{S}(k)=(\tilde{S}(k,1),\tilde{s}(k,2))$, $\tilde{s}_k(j)$ is the modulated signal transmitted by the relays in the DAF relay group, at time $2(k-1)+j$. The relay i in the DAF relay group will then forward the modulated symbols $\tilde{S}$ with power $P_{r,i}$ to the destination, $$x_{r,i}(k,j) = \sqrt{P_{r,i}} \tilde{s}(k,j), i \in \Omega_{DAF} \quad (73)$$

The received signals at the destination, transmitted from the relay i in the DAF relay group (see 214 in FIG. 4), become:

$$y_{rd,i}(k,j) = G_{rd,i} h_{rd,i} \sqrt{P_{r,i}} \tilde{s}(k,j) + n_{rd,i}(k,j), i \in \Omega_{DAF} \quad (74)$$

At the destination, all signals forwarded from the DAF relay group, at time $2(k-1)+j$, are then combined together. Let $y_{rd,DAF}(k,j)$ represent the combined signal, given by:

$$y_{rd,DAF}(k,j) = \sum_{i \in \Omega_{DAF}} w_{r,i} y_{rd,i}(k,j) \quad (75)$$
$$= \sum_{i \in \Omega_{DAF}} w_{r,i} \left(h_{rd,i} \sqrt{P_{rd,i}}\right) \tilde{s}(k,j) + n_{rd,i}(k,j)$$
$$= A_{DAF} \tilde{s}(k,j) + n_{rd,DAF}(k,j)$$

where $$A_{DAF} = \sum_{i \in \Omega_{DAF}} y_{rd,i} |h_{rd,i}|^2$$

and $n_{rd,DAF}(k,j)$ is an equivalent noise after combination, with zero mean and a variance of $\sigma_{rd,DAF}^2 = A_{DAF}$.

From Equations (35) and (39), the received SNR for the combined signals in the AAF and DAF relay group, denoted by $y_{AAF}$ and $y_{DAF}$, can be calculated as $$y_{AAF} = \frac{A_{AAF}^2}{\sigma_{rd,AAF}^2} = A_{AAF}, y_{DAF} = \frac{A_{DAF}^2}{\sigma_{rd,DAF}^2} = A_{DAF} \quad (76)$$

An overall codeword at the destination consists of the combined coded information symbols transmitted from the AAF relay group and the combined coded symbols of the interleaved information sequence sent from the DAF relay group. They form a distributed turbo code.

Let I(k) represent the interleaved position of k. For a RSC code, $y_{rd,AAF}(k,1)$ and $y_{rd,DAF}(I(k),1)$, k=1, ..., l, carry the same information symbol b(k), thus they should be properly combined before sending to each decoder. Let $y_{AAF,Info}(k)$ and $y_{DAF,Info}(k)$ be the combined signal and its interleaved one. Following the similar calculations as in the AAF and DAF groups, the optimal combination of $y_{rd,AAF}(k,1)$ and $y_{rd,DAF}(I(k),1)$ can be formulated as follows:

$$y_{AAF,Info}(k) = y_{rd,AAF}(k,1) + y_{rd,DAF}(I(k),1) = (A_{AAF} + A_{DAF})s(k,j) + n_{rd,AAF}(k,j) + n_{rd,DAF}(I(k),j);$$

and $$y_{DAF,Info}(k) = y_{rd,AAF}(I^{-1}(k),1) + y_{rd,DAF}(k,1) = (A_{AAF} + A_{DAF})\tilde{s}(k,j) + n_{rd,AAF}(I^{-1}(k),j) n_{rd,DAF}(k,j), \quad (77)$$

where $I^{-1}(k)$ represents the de-interleaved position of k. Let $y_{AAF} = (y_{AAF}(1), \ldots y_{AAF}(k) \ldots y_{AAF}(l))$ $y_{DAF} = (y_{DAF}(1), \ldots y_{DAF}(k) \ldots y_{DAF}(l))$, $y_{AAF}(k) = (y_{AAF,Info}(k), y_{rd,AAF}(k,2))$, and $y_{rd,DAF}(k) = (y_{DAF,Info}(k), y_{rd,DAF}(k,2))$.

These two signals are then sent to two MAP decoders associated with $y_{AAF}$ and $y_{DAF}$, respectively. A turbo iterative decoding algorithm is then performed between these two decoders; see 220 in FIG. 4. The decoders with $y_{AAF}$ and $y_{DAF}$ as input symbols calculate the a posteriori probability (APP) of the information symbols and the interleaved information symbols, denoted by $P(b(k)=w|y_{AAF})$ and $P(b(k)=w|y_{DAF})$, and the corresponding extrinsic information, respectively. The extrinsic information of one decoder is used to update the a priori probability of the other decoder in the next iteration. After several iterations, the decision is made based on the APPs of the first decoder.

$P(b(k)=w|y_{AAF})$ and $P(b(k)=w|y_{DAF})$ can be calculated as $$P(b(k)=w|y_{rd,AAF}) = \quad (78)$$
$$h^{AAF} \sum_{m,m'=0,b(k)=w}^{m,m'=M_s-1} \alpha_{k-1}^{AAF}(m')\beta_k^{AAF}(m)\gamma_k^{AAF}(m,m')$$

$$P(b(k)=w|y_{rd,DAF}) = \quad (79)$$
$$h^{DAF} \sum_{m,m'=0,b(k)=w}^{m,m'=M_s-1} \alpha_{k-1}^{DAF}(m')\beta_k^{DAF}(m)\gamma_k^{DAF}(m,m')$$

where $h^{AAF}$ and $h^{DAF}$ are constants such that $$\sum_w P(b(k)=w|y_{rd,AAF}) = 1 \quad (80)$$
and
$$\sum_w P(b(k)=w|y_{rd,DAF}) = 1$$

$$\gamma_k^{AAF}(m,m') = \exp\left(\frac{-|y_{AAF}(k,1)-(A_{AAF}+A_{DAF})s(k,1)|^2}{\sigma_{rd,AAF}^2 + \sigma_{rd,AAF}^2} + \frac{-|y_{AAF}(k,2)-A_{AAF}s(k,2)|^2}{\sigma_{rd,AAF}^2}\right) \quad (81)$$

$$\gamma_k^{DAF}(m,m') = \exp\left(\frac{-|y_{DAF}(k,1)-(A_{AAF}+A_{DAF})\tilde{s}(k,1)|^2}{\sigma_{rd,AAF}^2 + \sigma_{rd,DAF}^2} + \frac{-|y_{DAF}(k,2)-A_{DAF}\tilde{s}(k,2)|^2}{\sigma_{rd,DAF}^2}\right) \quad (82)$$

m' and m are a pair of states connected with $b_k = w$ in the trellis, $M_s$ is the number of states in the trellis and $\alpha_i(m')$ and $\beta_i(m)$ are the feed-forward and the feedback recursive variables.

There is one possible scenario that for some transmission blocks there are no relays that can make correct decoding. This could happen at low signal to noise ratios. In this case, there are no relays in the DAF relay group and all relays are in AAF relay group, so we only need to decode $y_{rd,AAF}$, from which we get the information symbol estimates.

Performance Analysis of DTC-ARP

We first consider a scenario where the AAF relay group consists of q relays numbered from 1 to q and the DAF relay group consists of (n−q) relays numbered from (q+1) to n. The conditional pairwise error probability (PEP) that the decoder decides in favor of another erroneous codeword with Hamming weight d, for the above scenario, is given by:

$$P_{(q)}(d|h_{sd},h_s,h_{rd}) = Q(\sqrt{2d_1 y_{AAF,q} + 2d_2 y_{DAF,(n-q)}}) \quad (83)$$

where $d_1$ and $d_2$ are the Hamming weights of the erroneous codewords with Hamming weight d, transmitted from the AAF and DAF group, respectively, such that $d = d_1 + d_2$.

By averaging (47) with respect to the channel, we have $$P_{(q)}(d) \leq (\gamma_{sd})^{-1}\left(\frac{1}{\gamma_{sr}} + \frac{1}{\gamma_{rd}}\right)^q (\gamma_{rd})^{-(n-q)}(d_1)^{-(q+1)}(d_2)^{-(n-q)} \quad (84)$$

The average PEP of the DTC-ARP at high SNR can be approximated as $P^{DTC-ARP}(d) \leq$ $$\sum_{q=0}^n p_q P_{(q)}(d) \leq \sum_{q=0}^n \binom{n}{q}(P_{F,sr})^q(1-P_{F,sr})^{n-q}(\gamma_{sd})^{-1} \quad (85)$$
$$\left(\frac{1}{\gamma_{sr}} + \frac{1}{\gamma_{rd}}\right)^q (\gamma_{rd})^{-(n-q)}(d_1)^{-(q+1)}(d_2)^{-(n-q)}$$
$$= ((\gamma_{sd})^{-1}(\gamma_{rd})^{-n})(d_1)^{-1}(d_2)^{-n}$$
$$\left[\frac{d_2}{d_1}\left(\frac{\gamma_{rd}}{\gamma_{sr}}+1\right)P_{F,sr}+(1-P_{F,sr})\right]^n$$
$$= ((\gamma_{sd})^{-1}(\gamma_{rd})^{-n})(d_1)^{-1}(d_2)^{-n}$$
$$\left[\left(\frac{d_2}{d_1}\left(\frac{\gamma_{rd}}{\gamma_{sr}}+1\right)-1\right)P_{F,sr}+1\right]^n$$

Similarly, for a perfect DTC, for which all relay can decode correctly, the average PEP of incorrectly decoding to a codeword with weight d, denoted by $P_{DTC}^{Perfect}(d)$, can be calculated as:

$$P_{DTC}^{Perfect}(d) = E\left(Q\left(\sqrt{2d_1 \gamma_{sd}|h_{sd}|^2 + 2d_2 \gamma_{rd}\sum_{i=1}^n |h_{rd,i}|^2}\right)\right) \leq \quad (86)$$
$$(\gamma_{sd})^{-1}(\gamma_{rd})^{-n}(d_1)^{-1}(d_2)^{-n}$$

(85) can be further written as:

$$P^{DTC-ARP}(d) \leq \left[\left(\frac{d_2}{d_1}\left(\frac{\gamma_{rd}}{\gamma_{sr}}+1\right)-1\right)P_{F,sr}+1\right]^n P_{DTC}^{Perfect}(d) = \quad (87)$$

$$G_{GDTC} P_{DTC}^{Perfect}(d)$$

where $$G_{GDTC} = \left[\left(\frac{d_2}{d_1}\left(\frac{\gamma_{rd}}{\gamma_{sr}}+1\right)-1\right)P_{F,sr}+1\right]^n$$

represents the BER increase of the DTC-ARP compared to the perfect DTC under the same SNR.

It can be noted that as $y_{sr} \to \infty$, $G_{GDTC} \to 1$ and the performance of the DTC-ARP approaches the perfect DTC.

Distributed Turbo Coding with Relay Selection using Adaptive Relaying Protocol (DTC-RS-ARP)

Figure 5:
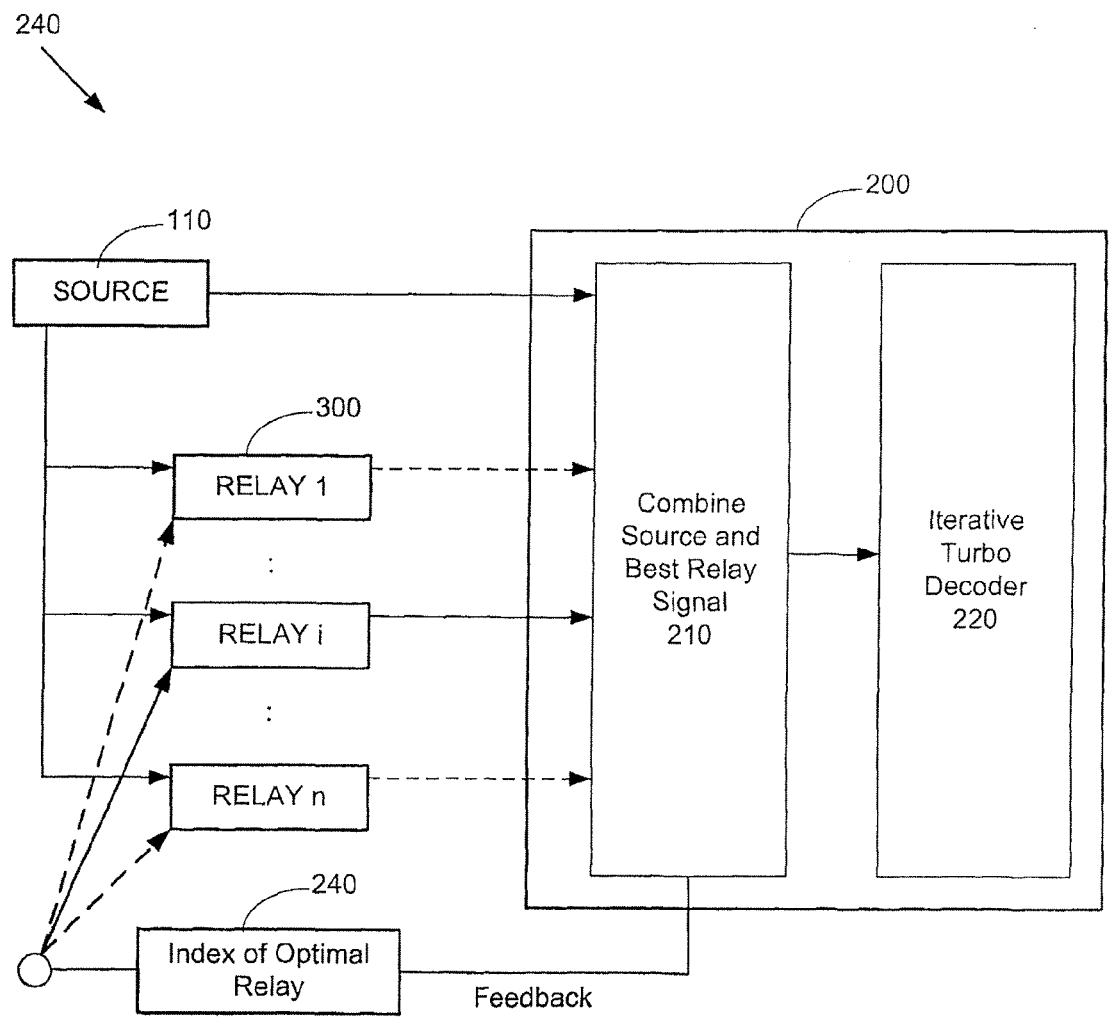
FIG. 5 is a block diagram of adaptive relaying protocol with relay selection and distributed turbo decoding (DTC-RS-ARP).

Adaptive relaying protocol (ARP), distributed turbo coding (DTC) and relay selection (RS) may be further combined in a protocol shown in FIG. 5. Among all the relays, we select one relay with maximum destination SNR. If the selected relay is from a DAF group, it will decode the received signals, interleave, re-encode and forward them to the destination. At destination, the signals directly transmitted from the source and that from the selected relay in the DAF group will form a DTC codeword. If it is selected from an AAF group, it will amplify and forward the signals to the destination. We refer to such a scheme as the DTC with single selected relay (DTC-RS-ARP).

Similar to the performance analysis for ARP, RS-ARP and DTC-ARP, we first consider the case when the AAF relay group consists of q relays numbered from 1 to q and the DAF relay group consists of (n−q) relays numbered from (q+1) to n. Let $P_q^{DTC-SSR}(d)$ denote the average PEP of the DTC-RS-ARP that the decoder decides in favour of another erroneous codeword with Hamming weight d in this case, and it can be approximated at high SNR as $$P_q^{DTC-SSR}(d) \leq \quad (88)$$

$$d_1^{-1} d_2^{-n}(\gamma_{sd})^{-1}(n)! \left(\frac{q}{n}\left(\left(\frac{d_1}{d_2}\right)^{-n}-1\right)+1\right)(\gamma_{rd}^{-1})^{n-q}(\gamma_{sr}^{-1}+\gamma_{rd}^{-1})^q$$

The average PEP at high SNR can be approximated as $$P^{DTC-SSR}(d_1) \leq \sum_{q=0}^{n} P_q^{DTC-SSR}(d) P_{(q)}(d) \leq \quad (89)$$

$$d_1^{-1} d_2^{-n}(\gamma_{sd})^{-1}(n)! \sum_{q=0}^{n} \binom{n}{q}(P_{F,sr})^q(1-P_{F,sr})^{n-q}$$

$$\left(\frac{q}{n}\left(\left(\frac{d_1}{d_2}\right)^{-n}-1\right)+1\right)(\gamma_{rd}^{-1})^{n-q}(\gamma_{sr}^{-1}+\gamma_{rd}^{-1})^q =$$

$$d_1^{-1} d_2^{-n}(\gamma_{sd})^{-1}(n)! \left[((d_1/d_2)^{-n}-1)P_{F,sr}(\gamma_{sr}^{-1}+\gamma_{rd}^{-1})\right.$$

$$(P_{F,sr}\gamma_{sr}^{-1}+\gamma_{rd}^{-1})^{n-1}+(P_{F,sr}\gamma_{sr}^{-1}+\gamma_{rd}^{-1})^n\right] = d_1^{-1} d_2^{-n}(\gamma_{sd})^{-1}$$

$$(n)!(P_{F,sr}\gamma_{sr}^{-1}+\gamma_{rd}^{-1})^n \left[((d_1/d_2)^{-n}-1)\frac{P_{F,sr}(\gamma_{sr}^{-1}+\gamma_{rd}^{-1})}{P_{F,sr}\gamma_{sr}^{-1}+\gamma_{rd}^{-1}}+1\right]$$

As the reference, we consider the perfect DTC-RS-ARP, for which all relays are assume to be decoded correctly and the optimal relay with maximum destination SNR will be selected out to form a distributed turbo coding. The average PEP of perfect DTC-RS-ARP, denoted by:

$$P_{Perfect}^{DTC-Selection}(d) \leq d_1^{-1} d_2^{-n}(\gamma_{sd})^{-1}(n)! \gamma_{rd}^{-n} \quad (90)$$

Similar to the RS-ARP, we compare Equations (89) with (90) to obtain the BER increase of the DTC-RS-ARP relative to the perfect DTC-RS-ARP, $$G_{DTC-SSR} = (P_{F,sr}\gamma_{rd}\gamma_{sr}^{-1}+1)^n \left[((d_1/d_2)^{-n}-1)\frac{P_{F,sr}(\gamma_{sr}^{-1}+\gamma_{rd}^{-1})}{P_{F,sr}\gamma_{sr}^{-1}+\gamma_{rd}^{-1}}+1\right] \quad (91)$$

As $y_{sr}$ increases, $G_{DTC-SSR} \to 1$ and the performance of the DTC-RS-ARP approaches the perfect DTC-RS-ARP.

Simulation Results and Discussions

We provide simulation results comparisons for various relaying schemes with various numbers of relays. All simulations are performed for a BPSK modulation and a frame size of 130 symbols over quasi-static fading channels. We use a 4-state recursive systematic convolutional code (RSC) with the code rate of 1/2. The generator matrix of the RSC is $$\left[1, \frac{1+D^2}{1+D+D^2}\right].$$

Frame Error Rate (FER) Performance of ARP

DAF relay protocol requires relays to fully decode the source information and this limits the performance of DAF to that of direct transmission between the source and relays, so it does not offer a diversity gain. Specifically, we compare AAF and ARP with the perfect DAF, which can always achieve a full diversity. For simplicity, we assume that $y_{sr,i}=y_{sr}$ and $y_{rd,i}=y_{rd}$ for all $i=1, \ldots, n$ and $y_{rd}$ and $y_{sd}$ are the same. We investigate the performance of the various relaying schemes when the average received SNR in the link from the source to the relay, denoted by $y_{sr}$, is fixed and that from the source to the destination, denoted by $y_{rd}$, and the one from the relay to the destination, $y_{sd}$, are varied.

Figure 6A:
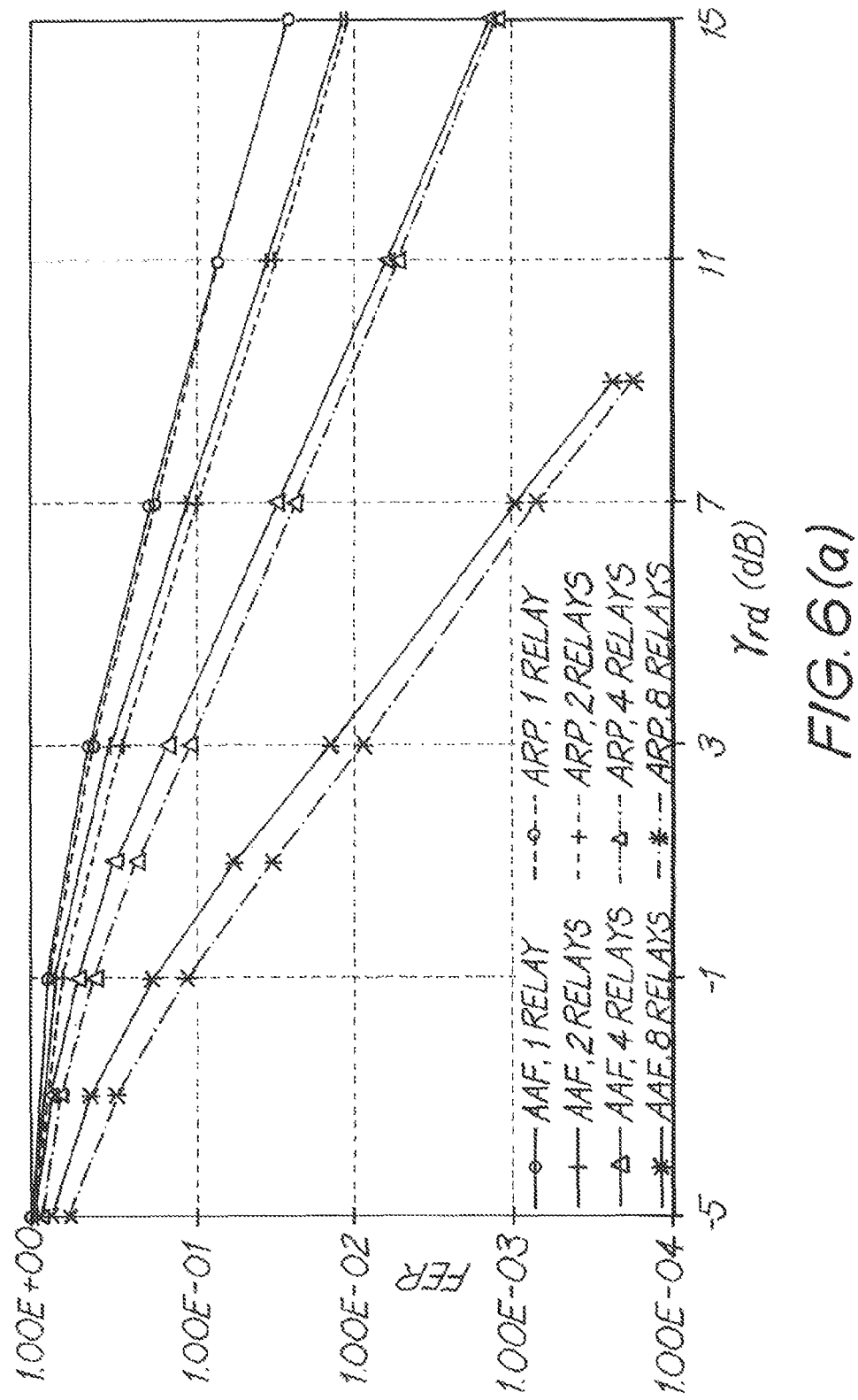
FIGS. 6(*a*), (*b*) and (*c*) show the FER performance of the adaptive relaying protocol (ARP) in a 2-hop network.
Figure 6B:
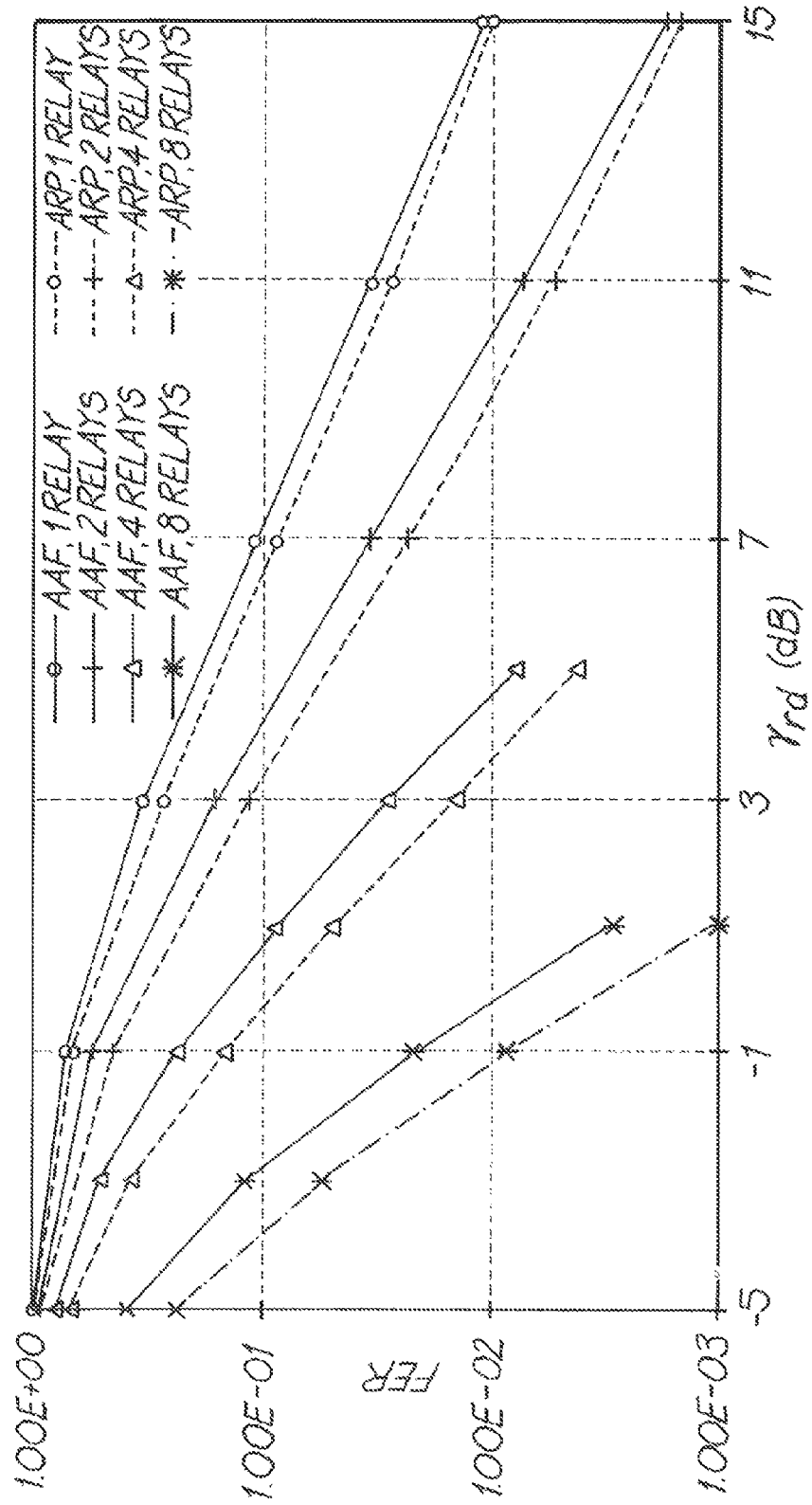
Figure 6C:
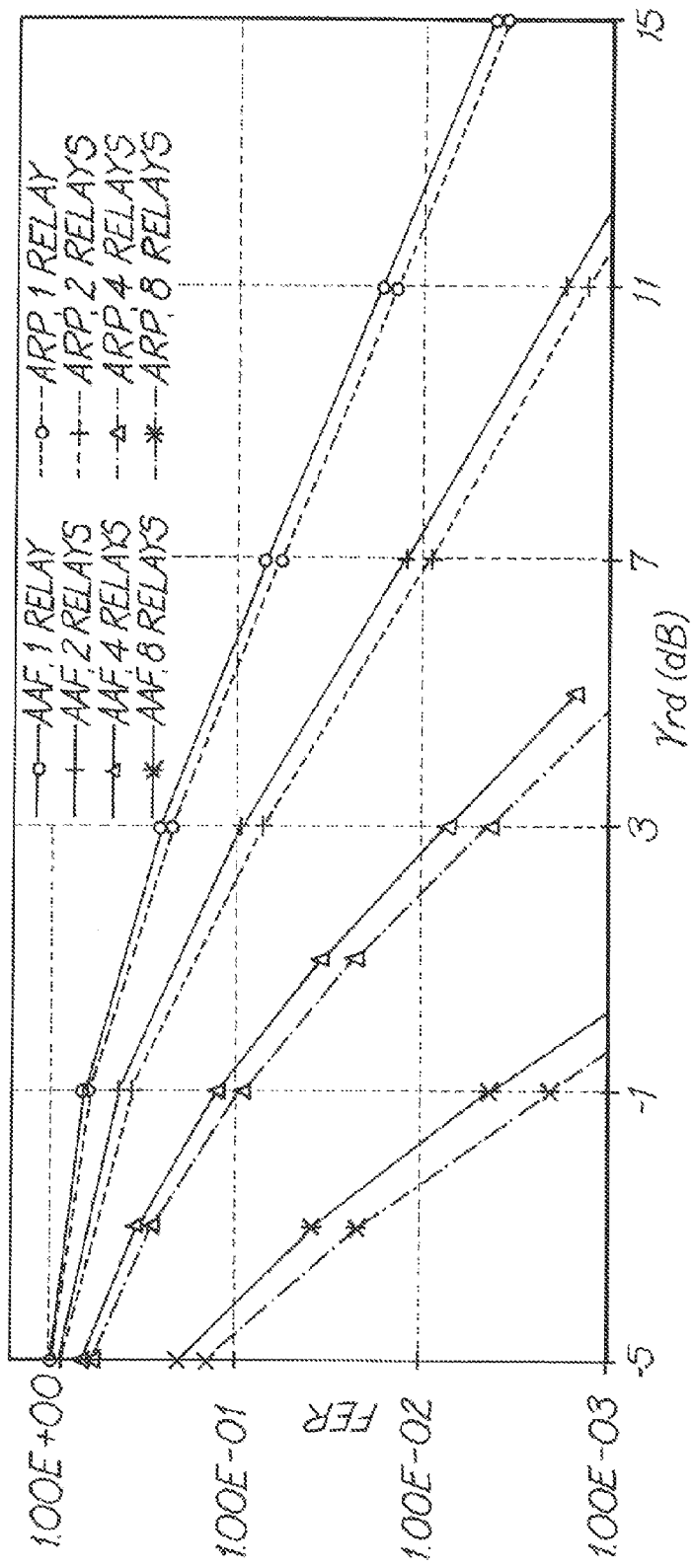

The FER performance of the AAF and the proposed ARP, as a function of $y_{rd}$ and with $y_{sr}$ as a parameter is shown in FIG. 6. The cases of $y_{sr}=1$ dB, 7 dB and 13 dB are illustrated in FIGS. 6(a), (b) and (c), respectively. When the quality of channels from the source to the relays is poor, as for example for $y_{sr}=1$ dB, we can see that the ARP outperforms the AAF at low $y_{rd}$ values, but it is close to the AAF as $y_{rd}$ increases. As the channel quality from the source to the relays is improved, such as $y_{sr}$ increases to 7 dB and 13 dB, the ARP can get a considerable coding gain compared to the AAF in the whole $y_{rd}$ region and this gain increases as the number of relays increases.

The above results can be explained from Equations (40) and (41). For low $y_{sr}$ value, $y_{rd}/y_{sr} \gg 1$, corresponding to the region of high $y_{rd}$ values in FIGS. 3-4, Equation (41) can be approximated by:

$$G_{ARP/AAF} \approx (P_{F,sr})^n$$

It can be noted from the above equations that for the low $y_{sr}$ and high $y_{rd}$ values, which corresponds to the FER performance at high $y_{rd}$ values in FIGS. 4 and 5, $P_{F,sr}$ is close to 1. Therefore for small n values, such n=1, 2, $G_{ARP/AAF} \approx (P_{F,sr})^n$ is close to 1, and the ARP and the AAF have the similar performance in this case. Since $G_{ARP/AAF}$ is a decreasing function of $y_{sr}$, as either $y_{sr}$ or n increases, $G_{ARP/AAF}$ is exponentially decreasing, and the ARP can achieve considerable performance gain compared to the AAF.

The performance gain can be easily explained in the following way. For low $y_{sr}$ values, the channel from the source to the relays is very noisy and probabilities of decoding errors at each relay are very high, so most of relays cannot correctly decode the received signals. The probability that the DAF group includes at least one relay is $1-(P_{F,sr})^n$. As the number of relays is small, $1-(P_{F,sr})^n$ approaches 0 and most of relays are included in the AAF relay group at very high chance and the DAF relay group only occasionally includes few relays, thus in this case, the ARP and the AAF have the similar performance. However even such a limited contribution of coding gain from the DAF relay group is significant if the channel from the relay to the destination is poor (corresponding to the low $y_{rd}$ values), because in this case the relays in the DAF relay group can considerably improve the overall channel quality. As the number of relays increases, $1-(P_{F,sr})^n$ also increases, that is, the probability that the DAF relay group contains at least one relays also increases and the contribution of coding gain from the DAF relay group become significant. This explain the reason why the ARP can provide a significant coding gain over AAF, even at low $y_{sr}$ values, as the number of relays increases.

Figure 7A:
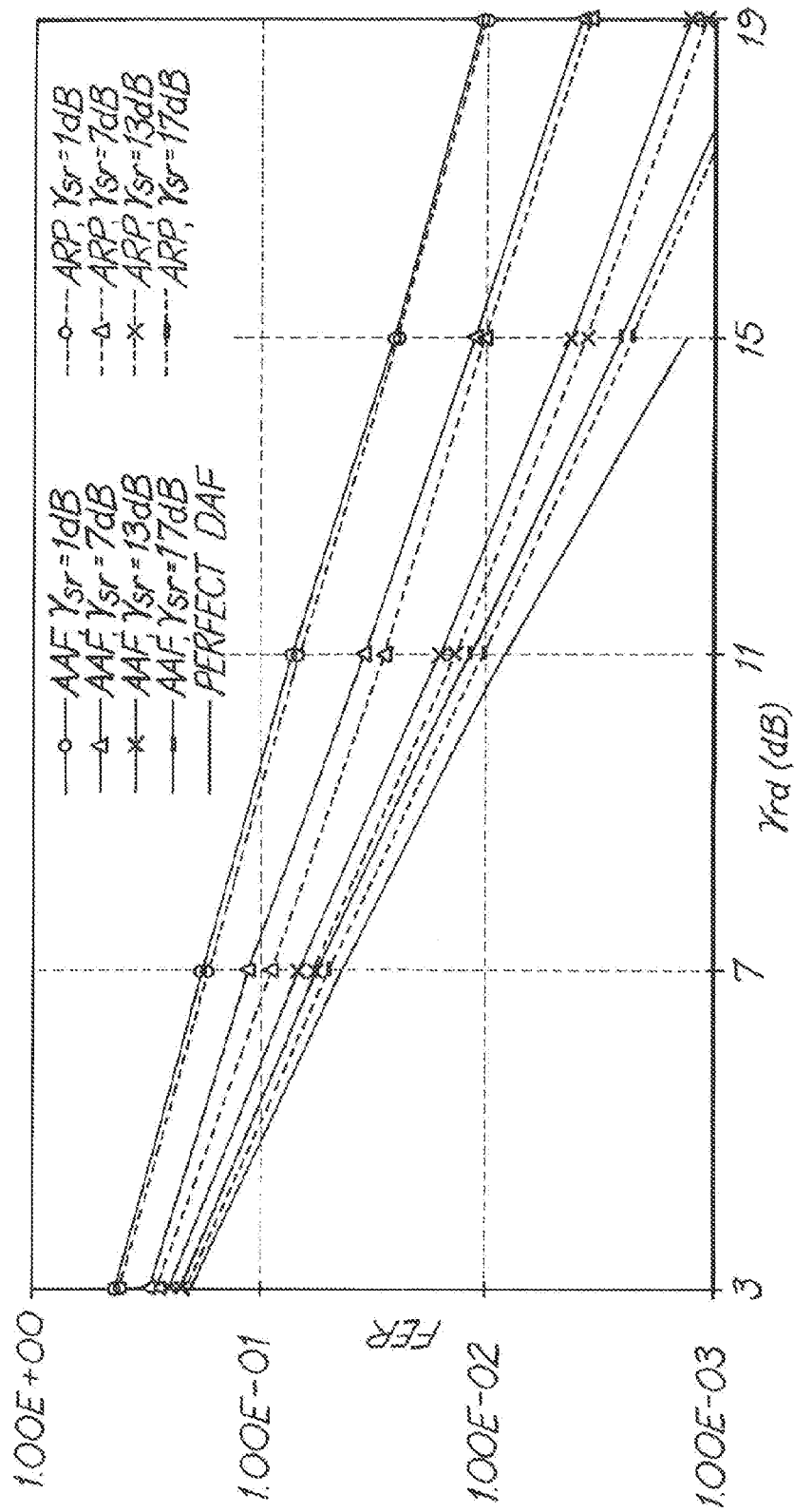
FIGS. 7(*a*) and (*b*) show the FER performance of adaptive relaying protocol (ARP) in a 2-hop network with 1 and 2 relays, respectively.
Figure 7B:
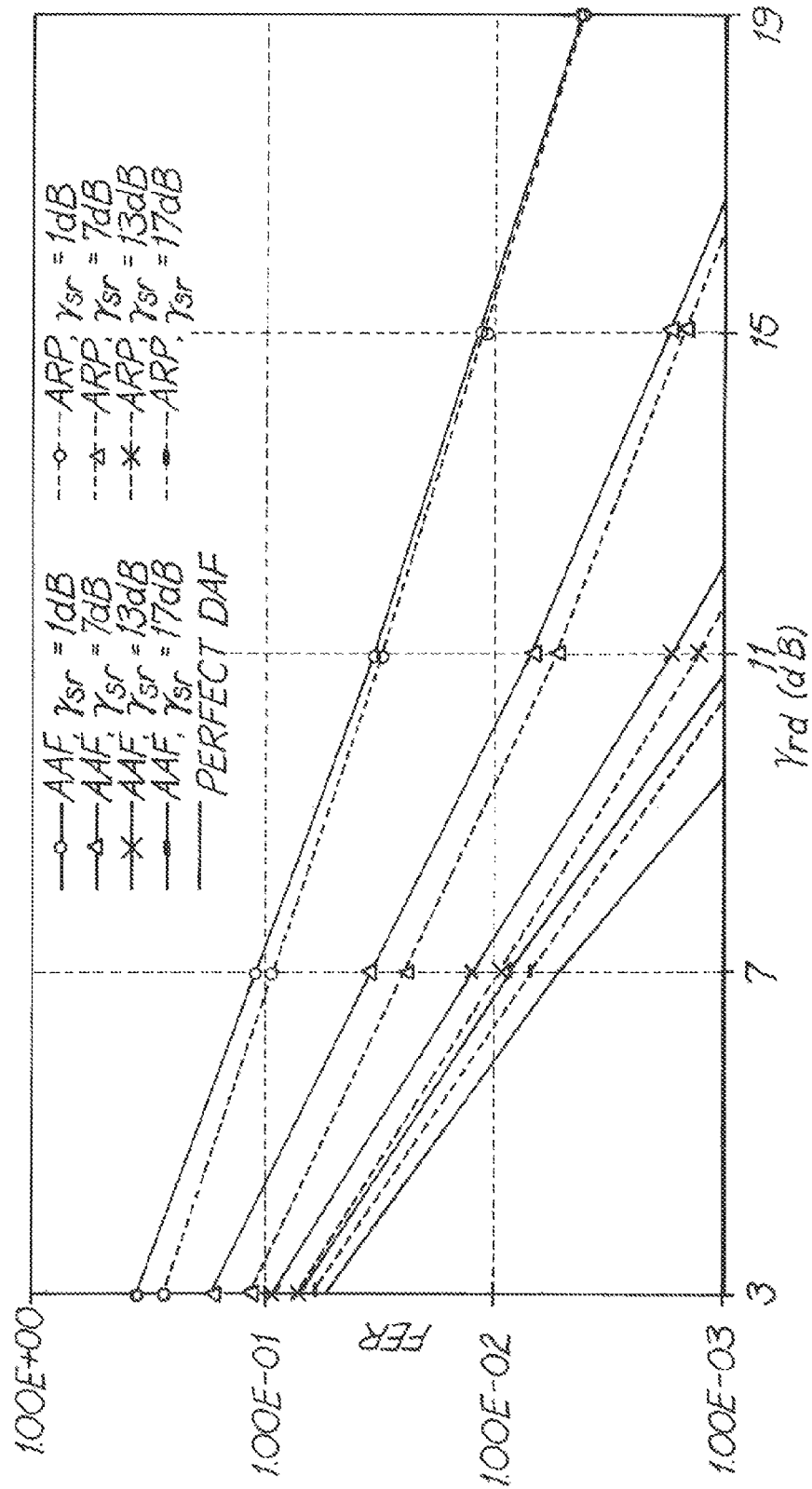
Figure 8A:
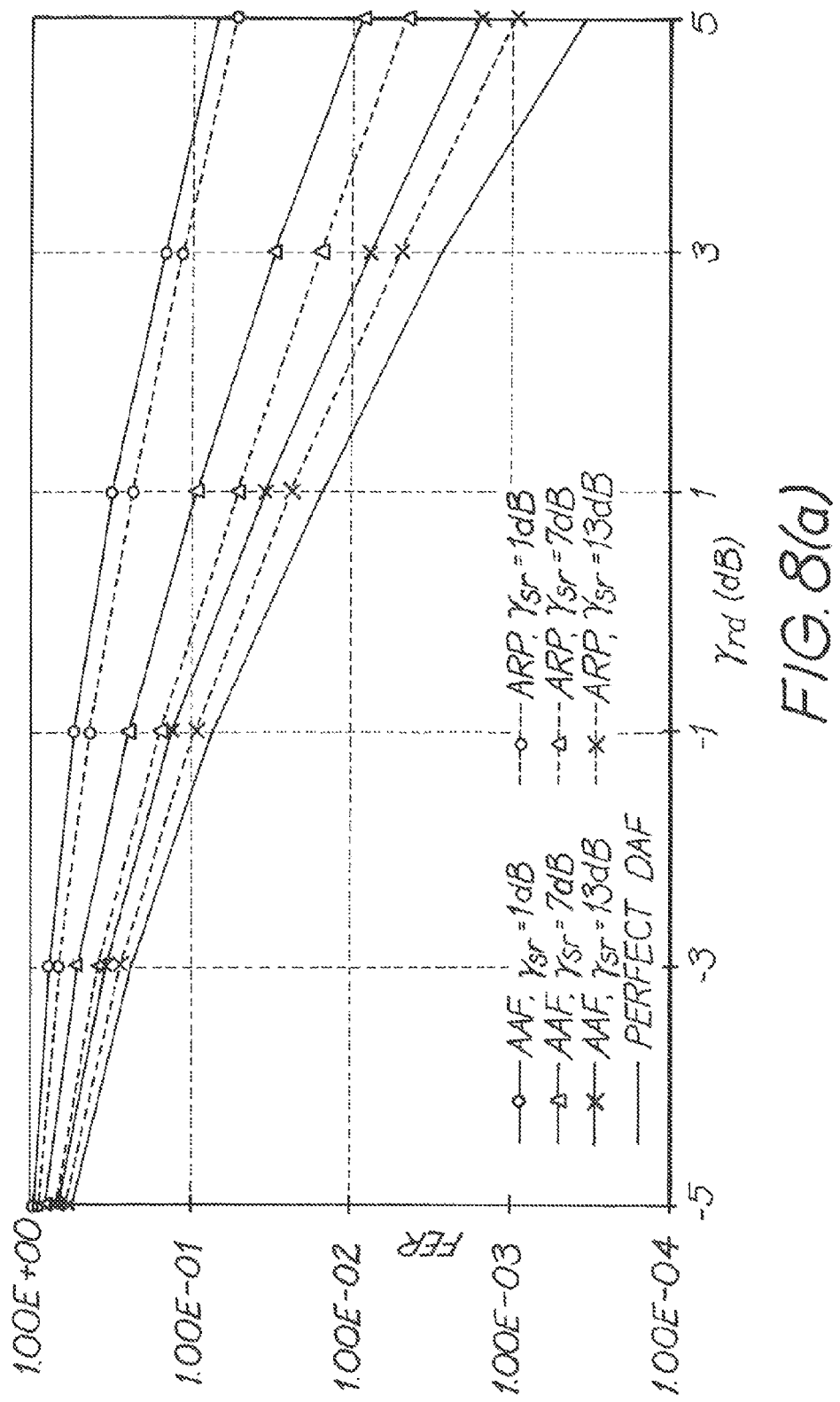
FIGS. 8(*a*) and (*b*) show the FER performance of adaptive relaying protocol (ARP) in a 2-hop network with 4 and 8 relays, respectively.
Figure 8B:
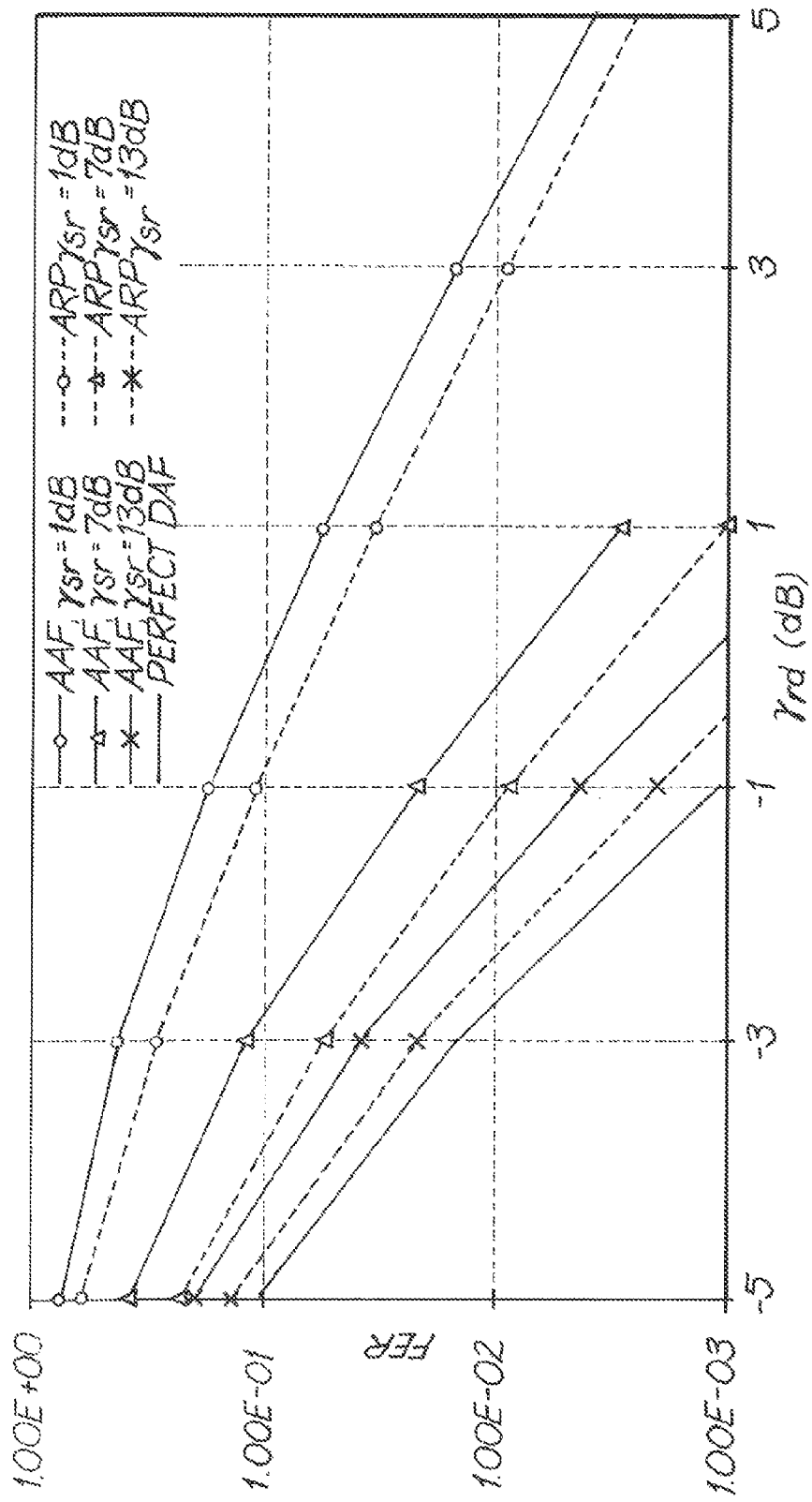

FIGS. 7 and 8 compare the performance of the AAF and the ARP with the perfect DAF for various numbers of relays. The cases of n=1, 2, 4 and 8 relays are illustrated in FIGS. 7(a), 7(b), 8(a) and 8(b), respectively. As the number of relays increases, the ARP significantly outperforms the AAF in the all SNR regions, and performs close to the perfect DAF as $y_{sr}$ increases. For a fixed $y_{sr}$, as $y_{rd}$ increases, the performance gap between the ARP and the perfect DAF also increases. This can also be observed from the theoretical results shown in Equation (36). For a fixed $y_{rd}$, as $y_{sr}$ increases, $P_{F,sr} \to 0$, $G_{ARP} \to 1$, and the performance of the ARP approaches the perfect DAF. Similarly, for a fixed $y_{sr}$, $G_{ARP}$ will be increased with $y_{rd}$. This is consistent with the simulation results.

FER Performance of RS-ARP

Figure 9A:
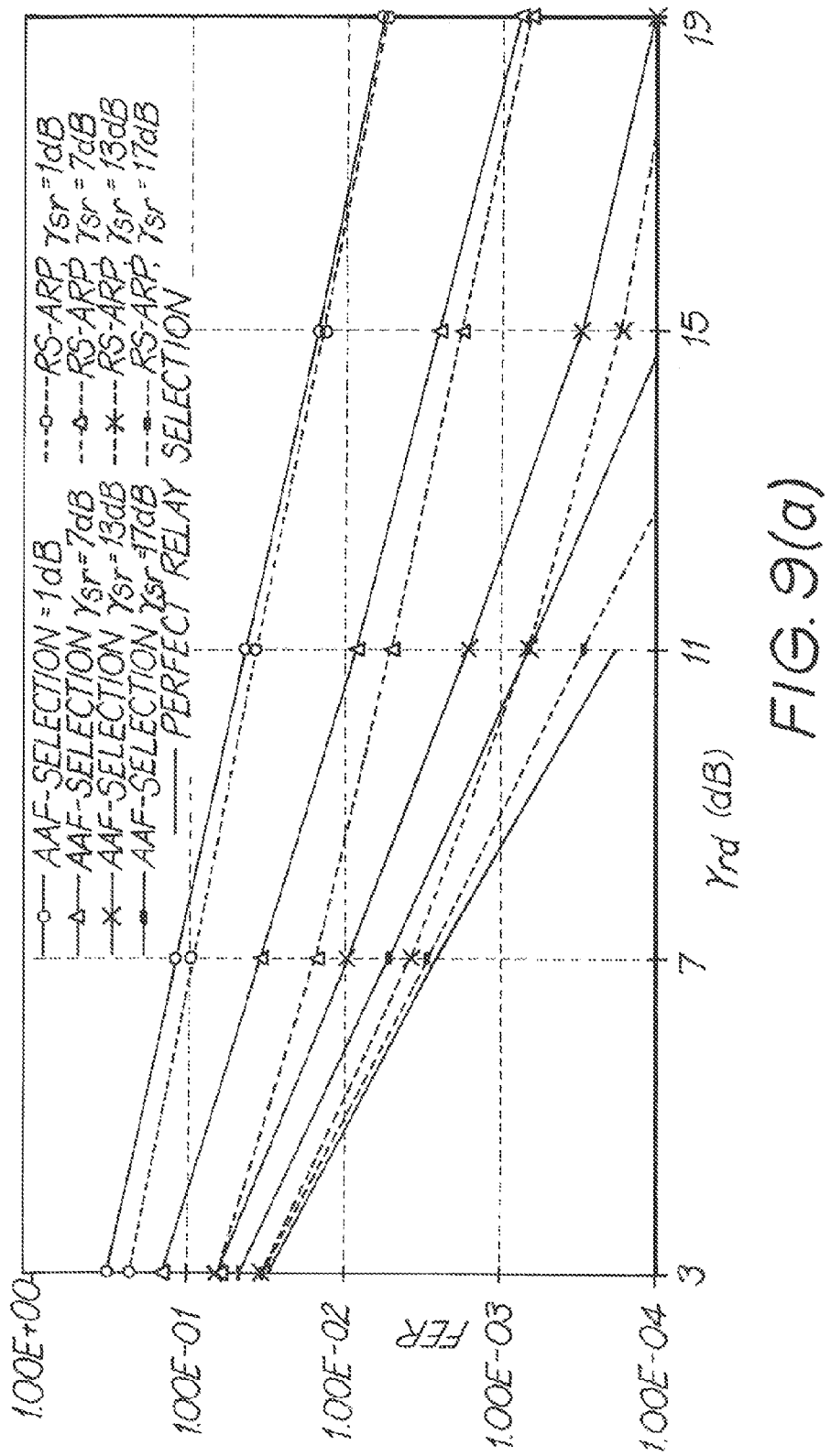
FIGS. 9(*a*), (*b*) and (*c*) show the FER performance of adaptive relaying protocol with relay selection (RS-ARP) in a 2-hop network with 2, 4 and 8 relays, respectively.
Figure 9B:
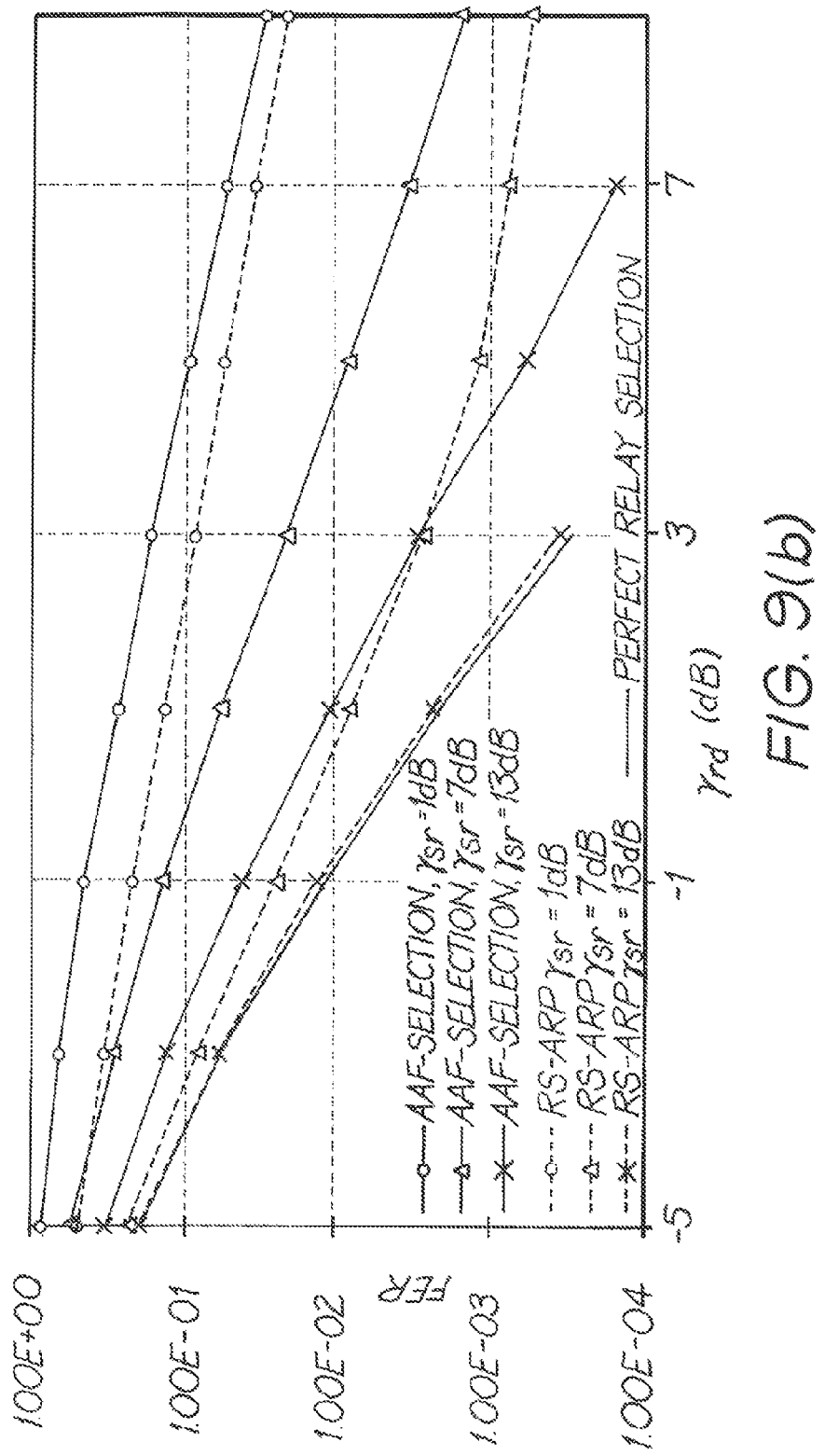
Figure 9C:
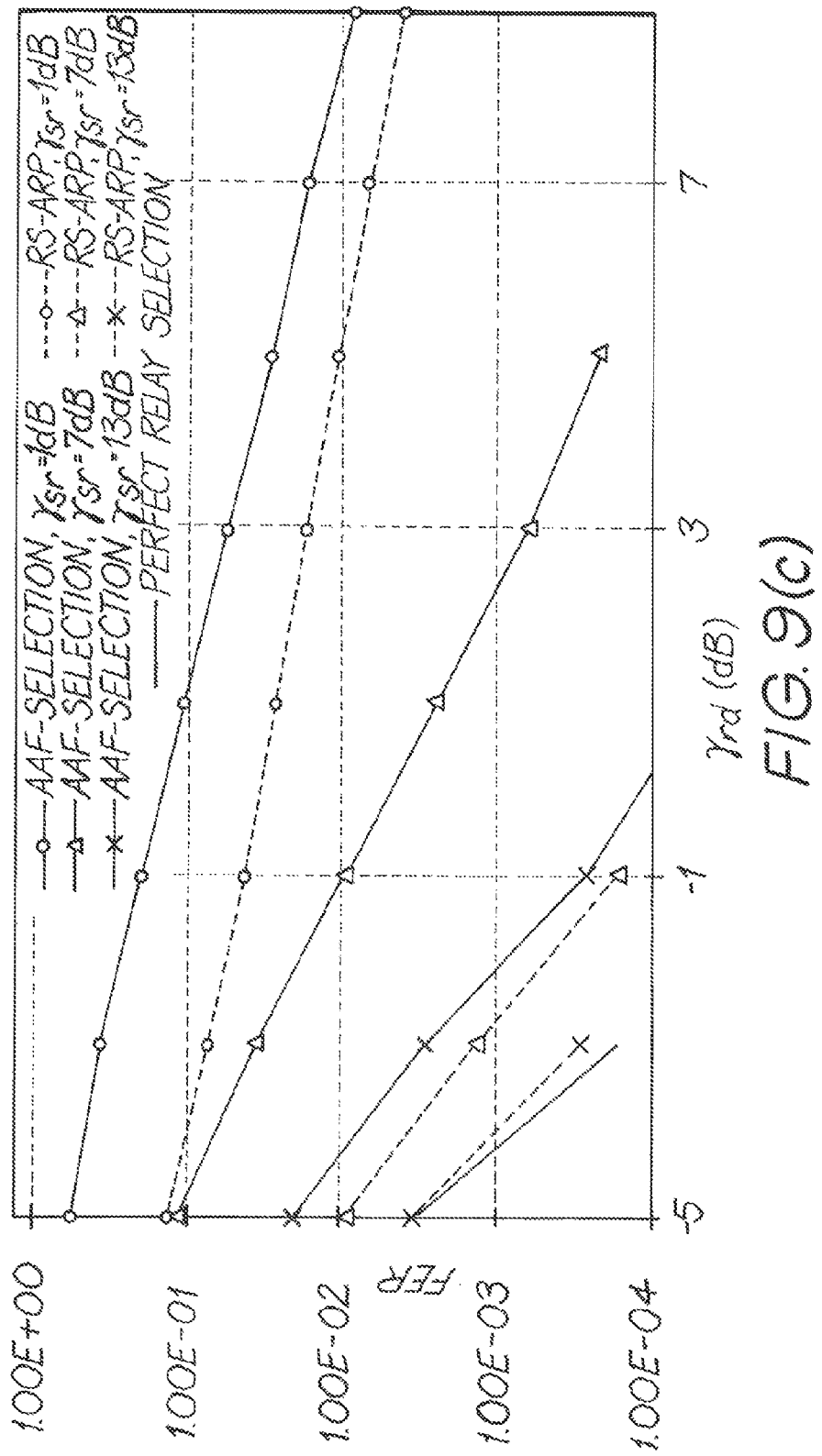

The FER performance of the AAF-selection, the proposed RS-ARP and the perfect DAF-selection for various number of relays, as a function of $y_{rd}$ and with $y_{sr}$ as a parameter is shown in FIG. 9. Specifically, the cases of When the quality of channel from the source to the relay is poor, as for example for $y_{sr}$=1 dB, it can be observed that the RS-ARP outperforms the AAF-selection at low $y_{rd}$ values. As the channel quality from the source to the relay is improved, such as $y_{sr}$ increases to 7 dB and 13 dB, the RS-ARP can get a significant coding gain compared to the AAF-selection in the whole $y_{rd}$ region. This gain will be significantly increased as the number of relays increases. FIG. 9 also compare the performance of the RS-ARP with the perfect DAF-selection for various numbers of relays. The cases of n=2, 4 and 8 relays are illustrated in FIGS. 9(a), (b) and (c), respectively. It can be noted that as $y_{sr}$ increases, the RS-ARP performs very close to the perfect DAF-selection.

The above results can be explained from Equation (70). For the low $y_{sr}$ values, $P_{F,sr}$ is close to 1. Therefore for small n values, such n=2, $G_{RS-ARP/AAF-S}$ is close to 1, and the RS-ARP and the AAF-Selection have the similar performance in this case. However, as $y_{sr}$ increases, $G_{RS-HRP/AAF-S}$ is significantly decreasing, thus RS-ARP can achieve a considerable performance gain. Furthermore, as n increases, such n=4 or 8, $G_{RS-HRP/AAF-S}$ is exponentially decreased, thus the RS-ARP can provide a significant gain compared to the AAF-selection. Furthermore, from Equation (67), we can see that as $y_{sr}$ increases $G_{RS-HRP}$ approaches 1, thus the RS-ARP approaches the perfect DAF-selection.

FER Performance of DTC-ARP

Figure 10A:
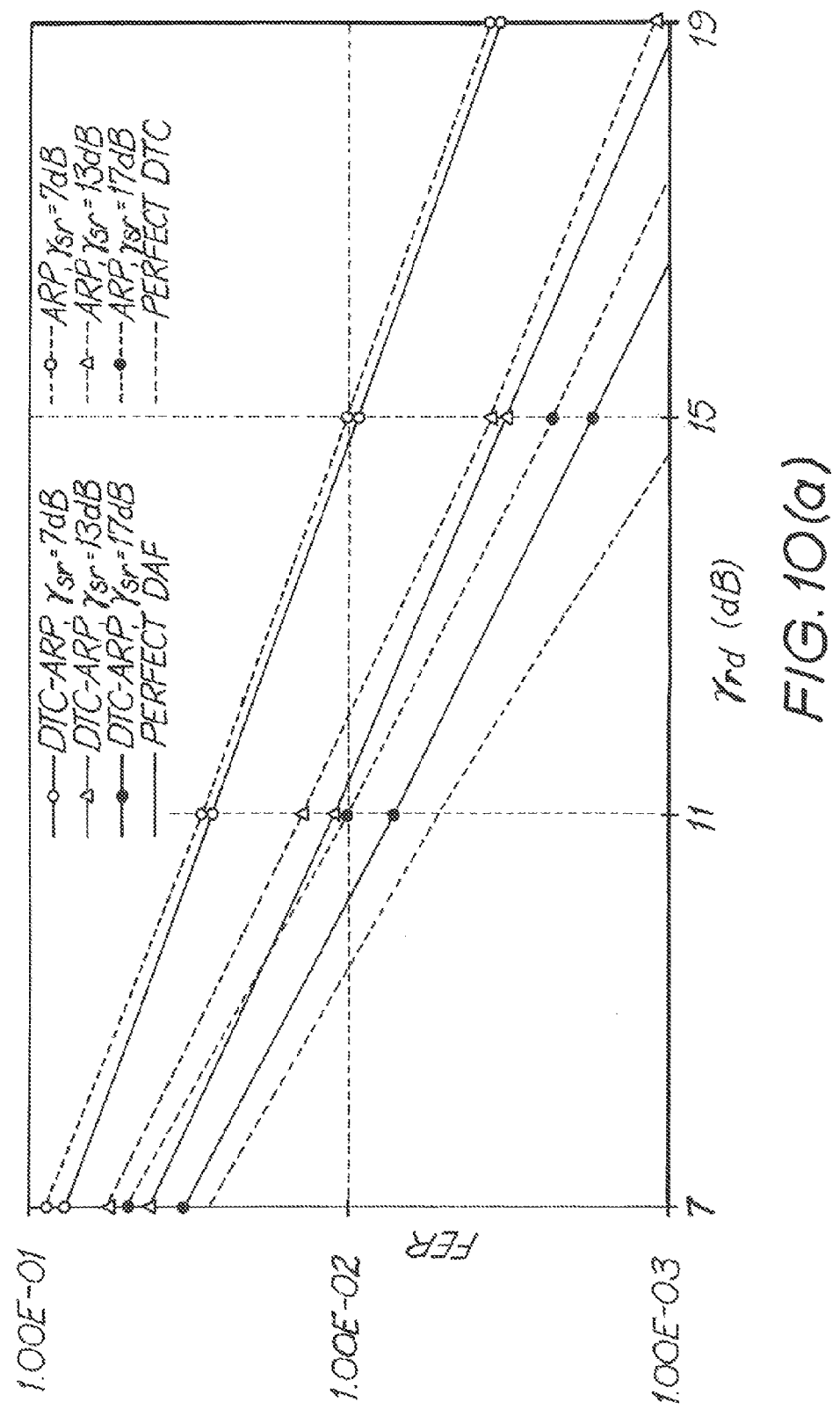
FIGS. 10(*a*) and (*b*) show the FER performance of adaptive relaying protocol with distributed turbo decoding (DTC-ARP) for 1 and 2 relays, respectively.
Figure 10B:
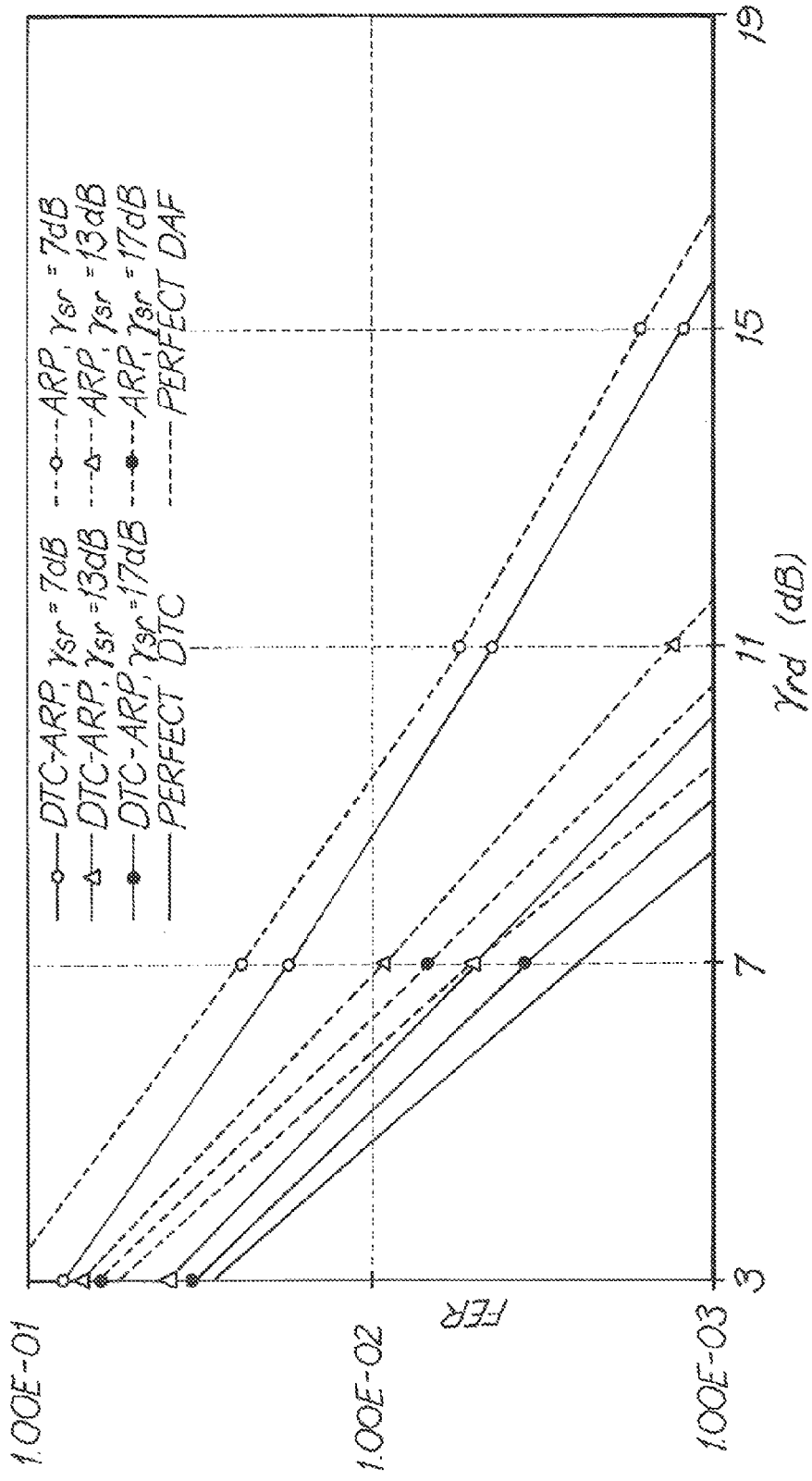
Figure 11A:
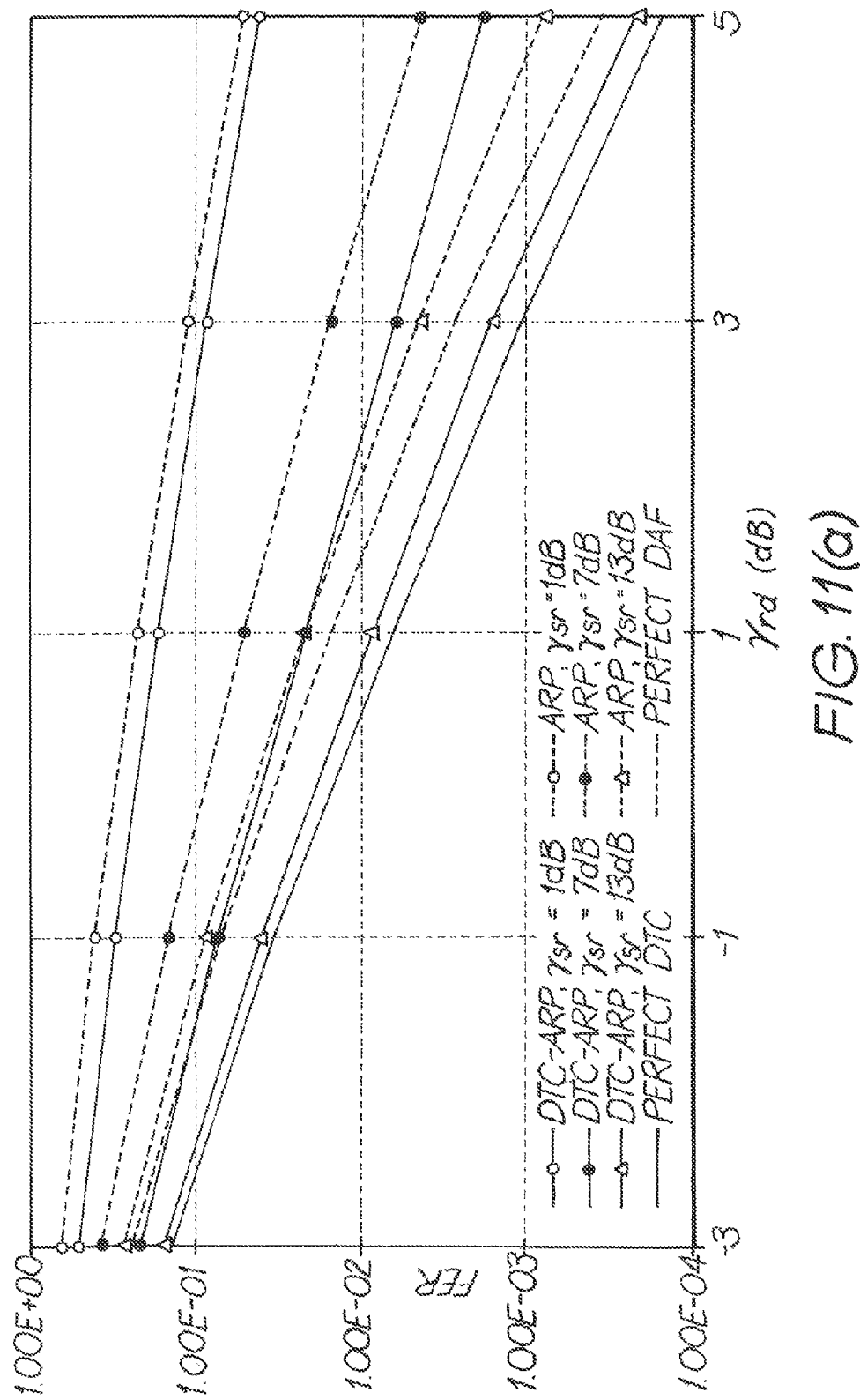
FIGS. 11(*a*) and (*b*) show the FER performance of adaptive relaying protocol with distributed turbo decoding (DTC-ARP) for 4 and 8 relays, respectively.
Figure 11B:
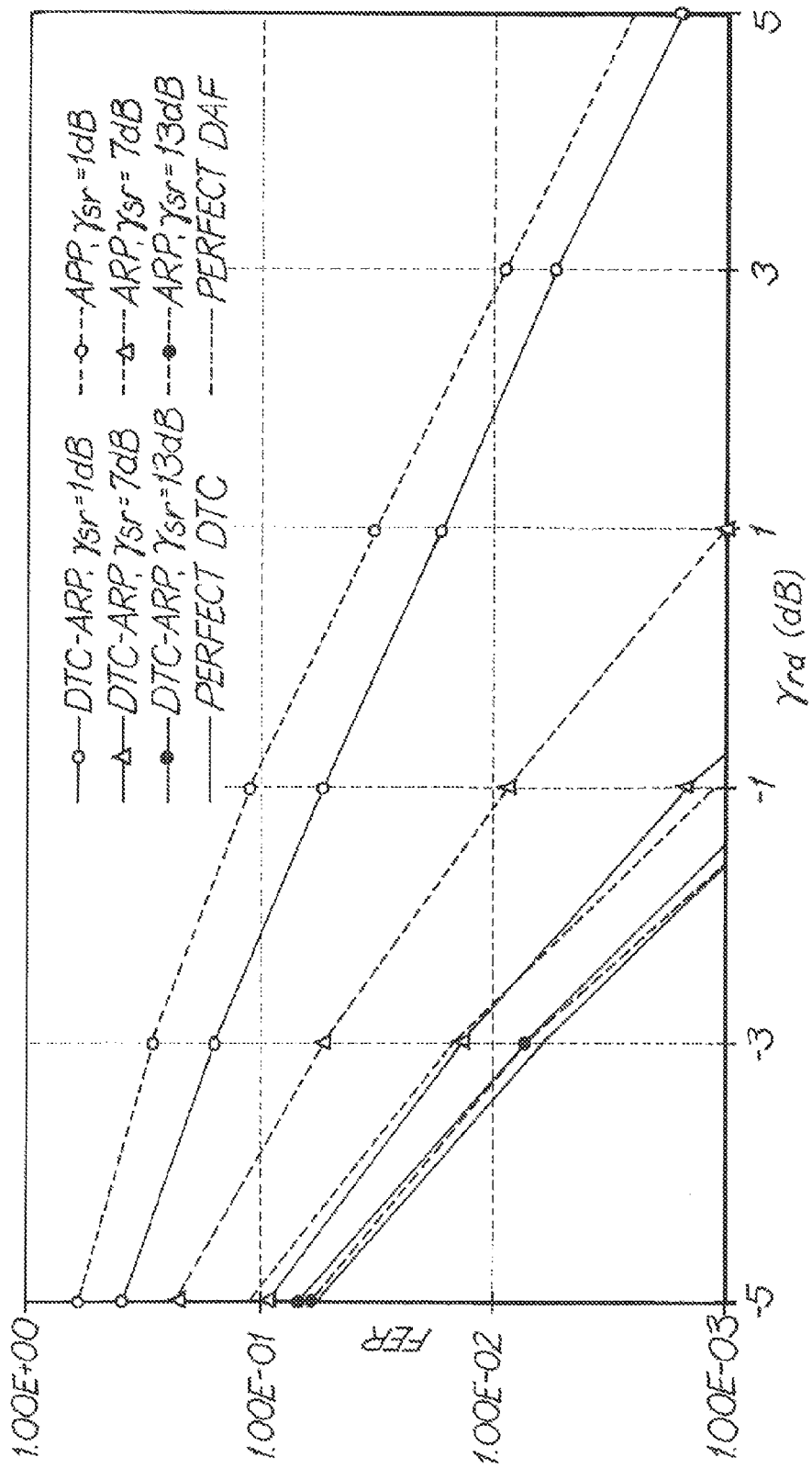

The performance of the ARP, DTC-ARP, perfect DAF and the perfect DTC-ARP with various numbers of relays is shown in FIGS. 10 and 11. The cases of n=1, 2, 4 and 8 relays are illustrated in FIGS. 10(a), 10(b), 11(a) and 11(b), respectively. It can be observed from these figures that the DTC-ARP provide a considerable gains compared to the ARP in all SNR regions due to the contribution of turbo coding gain in the DTC-ARP.

This gain significantly grows as the SNR and number of relays increases. It can also be observed from these figures that the performance of the DTC-ARP also approaches the perfect DTC as $y_{sr}$ increases. This is consistent with the analytical results shown in Equation (87).

FER Performance of DTC-RS-ARP

Figure 12A:
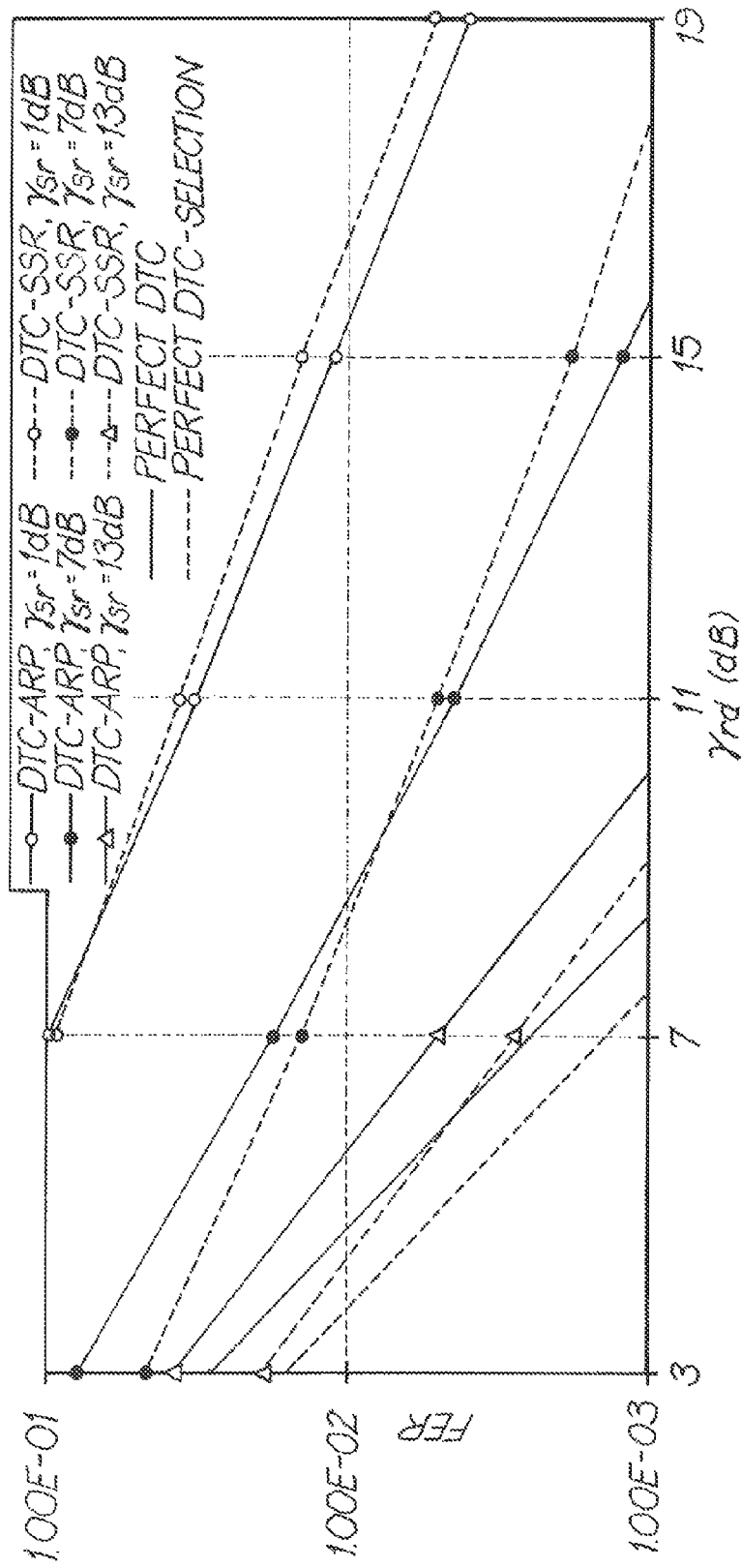
FIGS. 12(*a*), (*b*) and (*c*) show the FER performance of adaptive relaying protocol with relay selection and distributed turbo decoding (DTC-RS-ARP) in a 2-hop network with 2, 4 and 8 relays, respectively.
Figure 12B:
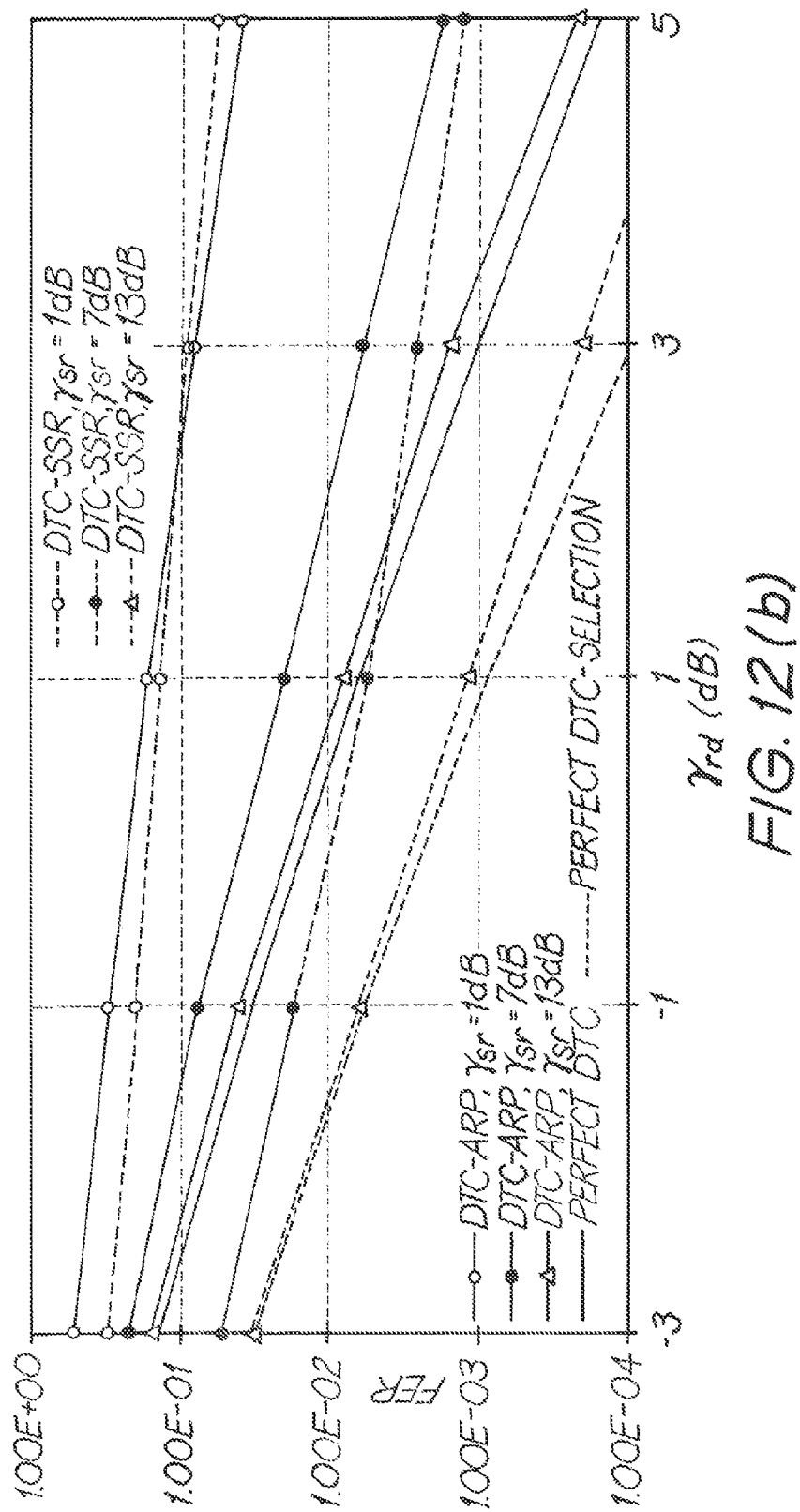
Figure 12C:
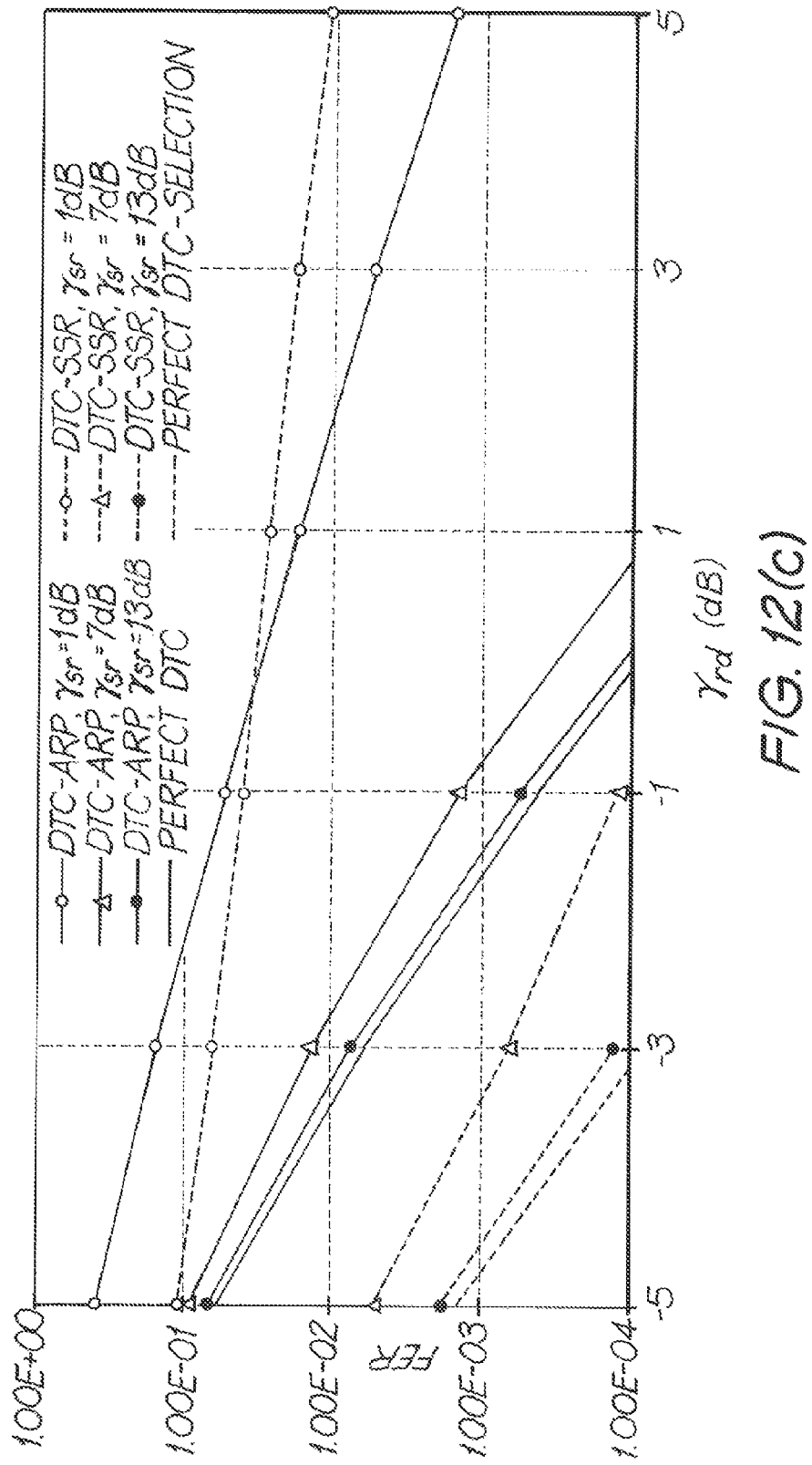

The performance of DTC-RS-ARP with DTC-ARP for various number relays is shown in FIG. 12. The cases of n=2, 4 and 8 relays are illustrated in FIGS. 12(a), (b) and (c), respectively. It can be observed that at low $y_{sr}$ and high $y_{rd}$ values, the DTC-ARP outperforms the DTC-SR-ARP. However as $y_{sr}$ increases, DTC-RS-ARP is significantly superior to the DTC-ARP. This can be explained as follows. For a DTC-RS-ARP scheme, the system is benefited from two major gains, received SNR gain contributed from relay selection and coding gain from the distributed turbo coding (DTC). In order to form a DTC codeword at the destination, the DAF group should include at least one relay. Let $P_{DAF}$ represent such a probability and it is given by $P_{DAF}=1-(P_{F,sr})^n$.

In the DTC-ARP, all the relays in the DAF group will participate in the relayed transmission. However, in the DTC-RS-ARP, only the relay with the maximum destination SNR is selected for transmission and it could be selected from either AAF or DAF group. At very low $y_{sr}$ values, $P_{DAF}$ is already very small, therefore the probability that the selected relay is from a DAF group becomes even much smaller compared to the DTC-ARP. In this case, DTC-ARP can provide more coding gain than the DTC-RS-ARP and the DTC-RS-ARP can provide more SNR gain. At low $y_{rd}$ values, the received SNR gain dominate the system performance because the DTC will not provide the system much coding gain at low SNR values, in this case, the DTC-RS-ARP can bring system a considerable SNR gain compared to the DTC-ARP. However as $y_{rd}$ increases, the coding gain contributed from the DTC will also increases and dominate the system performance and in this case the DTC-ARP outperforms the DTC-RS-ARP. As $y_{sr}$ increases, $P_{DAF}$ also significantly increases and both schemes contribute to the system similar coding gain, but the DTC-RS-ARP can provide more SNR gain compared to the DTC-ARP, thus has much better performance. Similarly, as $y_{sr}$ increases, the DTC-RS-ARP approaches the perfect DTC-RS-ARP very closely.

Figure 13:
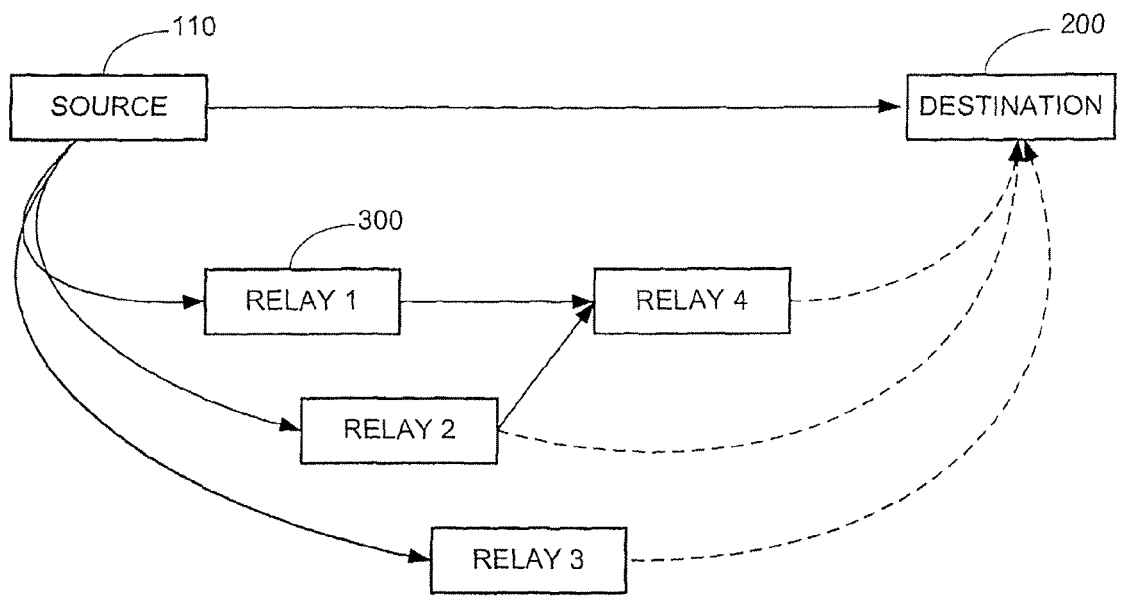
FIG. 13 is a block diagram of a system showing a source, a destination, and multiple relays.

Although the invention has been explained using a 2-hop wireless relay network, more intermediate relays may be added between the source and the destination and therefore forming a multi-hop network such as shown in FIG. 13. In particular, a signal may be relayed to more than one relay nodes before reaching the destination node.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:
1. A method for relaying signals, comprising information coded as symbols, through a wireless network comprising a source node, a destination node and a series of relay nodes that extend between the source node and the destination node; the method comprising steps of:
  receiving a signal at a relay node and decoding the received signal;
  wherein, at the relay node, if the received signal is decoded incorrectly, employing an Amplify-And-Forward (AAF) relaying protocol comprising steps of amplifying the received signal and then transmitting the amplified signal to a next relay node, in which the relay node and the next relay node are designated as belonging to an AAF relay group; but otherwise,
  at the relay node employing a Decode-And-Forward (DAF) relaying protocol comprising steps of interleaving decoded symbols, re-encoding decoded symbols and then transmitting the coded signal to next relay node, in which the relay node and the next relay node are designated as belonging to a DAF relay group; wherein:
  all the relays in the AAF relay group amplify the received signals from the source node and forward them such that the received signals ultimately reach the destination, and
  all the relays in the DAF relay group decode the received signals, interleave the decoded symbols, re-encode and forward the received signals such that the received signals ultimately reach the destination;
  and, at the destination node:
  wherein all signals forwarded via the AAF relay group are combined together and with signals directly transmitted from the source and are sent to a first Maximum a Posteriori Probability (MAP) decoder;
  wherein all signals forwarded via the DAF relay group are combined together and sent to a second MAP decoder;
  wherein the first and second MAP decoders perform a turbo iterative decoding algorithm between the first and second MAP decoder to calculate an a posteriori probability of the information symbols representing the information symbols corresponding extrinsic information, whereby the extrinsic information of one decoder is used to update the a priori probability of the other decoder in the next iteration;
  and wherein, after a number of iterations, a decision is made regarding the information decoded from each symbol.

2. The method according to claim 1, wherein the signal received at a relay node is amplified by an amplification factor that varies according to the transmit power constraint of the relay node and the power of the signal received.

3. The method according to claim 1, wherein the relay node receives a control signal from a downstream node after the downstream node has received an initial signal transmission; and depending on the control signal, the relay node either continues or stops relaying the signal received from the first node to the downstream node.

4. The method according to claim 1, wherein the first node is a source node or relay node and the downstream node is a relay node or a destination node.

5. A method according to claim 1, wherein all signals forwarded via either the AAF relay group or the DAF group are combined together so as to maximise Signal-to-Noise Ratio (SNR) of the combined signal.

6. A method according to claim 1, wherein the combined signals are then decoded in the MAP decoders using a Viterbi decoding algorithm.

7. A method according to claim 1, wherein a cyclic redundancy check (CRC) is performed to determine whether a signal has been successfully decoded at the relay node.

8. A method according to claim 1, wherein a best relay node is determined during an initial transmission cycle; the method further comprising the steps of:
  determining Signal-to-Noise Ratio (SNR) of channel between the destination node and each relay node;
  determining the best relay node, that is a relay node that has the maximum SNR at the destination node;
  and transmitting a control signal to all relay nodes; the control signal informing the best relay node to continue relaying and informing other relay nodes to stop relaying.

9. A method according to claim 8, wherein best relay node will relay signals from the source node to the destination node after the initial transmission cycle.

10. A method according to claim 8, wherein the control signal is transmitted to each relay node via a feedback channel or a reverse broadcast channel.

11. A relay system comprising:
  a source node to send signals comprising information coded as symbols through a wireless network to a destination node and one or more relay nodes that extend between the source node and the destination node;
  one or more relay nodes to receive signals from the source node and if the received signal is decoded incorrectly, employing an Amplify-And-Forward (AAF) relaying protocol comprising steps of amplifying the received signal and transmitting the amplified signal to a next relay node, in which case the relay node and the next relay node are designated as belonging to AAF relay group; but otherwise,
  at the relay node employing a Decode-And-Forward (DAF) relaying protocol comprising the steps of interleaving decoded symbols, re-encoding decoded symbols and then transmitting the coded signal to the next relay node, in which case the relay node and the next relay node are designated as belonging to DAF relay group; wherein:
  all the relays in the AAF relay group amplify the received signals from the source and forward the received signals such that the received signals ultimately reach the destination, and
  all the relays in the DAF relay group decode the received signals, interleave the decoded symbols, re-encode and forward the received signals such that the received signals ultimately reach the destination;
  and, at the destination node:
  wherein all signals forwarded via the AAF relay group are combined together and with signals directly transmitted from the source and are sent to a first Maximum a Posteriori Probability (MAP) decoder;
  wherein all signals forwarded via the DAF relay group are combined together and sent to a second MAP decoder;
  wherein the first and second MAP decoders perform a turbo iterative decoding algorithm between the first and second MAP decoder to calculate an a posteriori probability of the information symbols representing the information symbols corresponding extrinsic information, whereby the extrinsic information of one of the first or second MAP decoder is used to update an a priori probability of the other one of the first or second MAP decoder in a next iteration; and
  wherein, after a number of iterations, a decision is made regarding the information decoded from each symbol.

* * * * *